(12) United States Patent
Chang et al.

(10) Patent No.: US 12,255,102 B2
(45) Date of Patent: *Mar. 18, 2025

(54) METHODS OF FORMING OF INNER SPACER STRUCTURE USING SEMICONDUCTOR MATERIAL WITH VARIABLE GERMANIUM CONCENTRATION

(71) Applicant: Taiwan Semiconductor Manufacturing Co., Ltd., Hsinchu (TW)

(72) Inventors: Che-Lun Chang, Hsinchu (TW); Jiun-Ming Kuo, Taipei (TW); Ji-Yin Tsai, Hsinchu County (TW); Yuan-Ching Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/524,710

(22) Filed: Nov. 30, 2023

(65) Prior Publication Data
US 2024/0105814 A1 Mar. 28, 2024

Related U.S. Application Data

(63) Continuation of application No. 17/243,274, filed on Apr. 28, 2021, now Pat. No. 11,862,709.

(51) Int. Cl.
*H01L 21/8234* (2006.01)
*H01L 21/02* (2006.01)
(Continued)

(52) U.S. Cl.
CPC ........... *H01L 21/823412* (2013.01); *H01L 21/02532* (2013.01); *H01L 21/0259* (2013.01);
(Continued)

(58) Field of Classification Search
CPC ........... H01L 21/02532; H01L 21/0259; H01L 21/30604; H01L 21/3065;
(Continued)

(56) References Cited

U.S. PATENT DOCUMENTS 8,796,666 B1 8/2014 Huang
8,822,243 B2 9/2014 Yan
(Continued)

*Primary Examiner* — Cheung Lee
(74) *Attorney, Agent, or Firm* — HAYNES AND BOONE, LLP

(57) ABSTRACT

A first layer is formed over a substrate; a second layer is formed over the first layer; and a third layer is formed over the second layer. The first and third layers each have a first semiconductor element; the second layer has a second semiconductor element different from the first semiconductor element. The second layer has the second semiconductor element at a first concentration in a first region and at a second concentration in a second region of the second layer. A source/drain trench is formed in a region of the stack to expose side surfaces of the layers. A first portion of the second layer is removed from the exposed side surface to form a gap between the first and the third layers. A spacer is formed in the gap. A source/drain feature is formed in the source/drain trench and on a sidewall of the spacer.

20 Claims, 18 Drawing Sheets

(51) Int. Cl.
    *H01L 21/306*     (2006.01)
    *H01L 29/06*     (2006.01)
    *H01L 29/423*     (2006.01)
    *H01L 29/49*     (2006.01)
    *H01L 29/66*     (2006.01)
    *H01L 29/786*     (2006.01)

(52) U.S. Cl.
    CPC ............. *H01L 21/30604* (2013.01); *H01L 21/823431* (2013.01); *H01L 21/823468* (2013.01); *H01L 29/0665* (2013.01); *H01L 29/42392* (2013.01); *H01L 29/4908* (2013.01); *H01L 29/4983* (2013.01); *H01L 29/66545* (2013.01); *H01L 29/66553* (2013.01); *H01L 29/66636* (2013.01); *H01L 29/66742* (2013.01); *H01L 29/66795* (2013.01); *H01L 29/78618* (2013.01); *H01L 29/78696* (2013.01)

(58) Field of Classification Search
    CPC ..... H01L 21/823412; H01L 21/823431; H01L 21/823468; H01L 21/823481; H01L 29/0665; H01L 29/42392; H01L 29/4908; H01L 29/4983; H01L 29/66439; H01L 29/66545; H01L 29/66553; H01L 29/6656; H01L 29/66636; H01L 29/66742; H01L 29/66795; H01L 29/775; H01L 29/78618; H01L 29/78696; B82Y 10/00; B82Y 40/00
    See application file for complete search history.

(56) References Cited

U.S. PATENT DOCUMENTS

| | | |
|---|---|---|
| 8,987,142 B2 | 3/2015 | Lee |
| 9,053,279 B2 | 6/2015 | Chang |
| 9,093,530 B2 | 7/2015 | Huang |
| 9,099,530 B2 | 8/2015 | Lin |
| 9,153,478 B2 | 10/2015 | Liu |
| 9,501,601 B2 | 11/2016 | Shih-Ming |
| 9,548,303 B2 | 1/2017 | Lee |
| 9,876,114 B2 | 1/2018 | Jangjian |
| 2019/0214459 A1 | 7/2019 | Cheng |
| 2021/0217848 A1 | 7/2021 | Kim |
| 2021/0273047 A1* | 9/2021 | Kuan ................ H01L 29/66553 |

\* cited by examiner

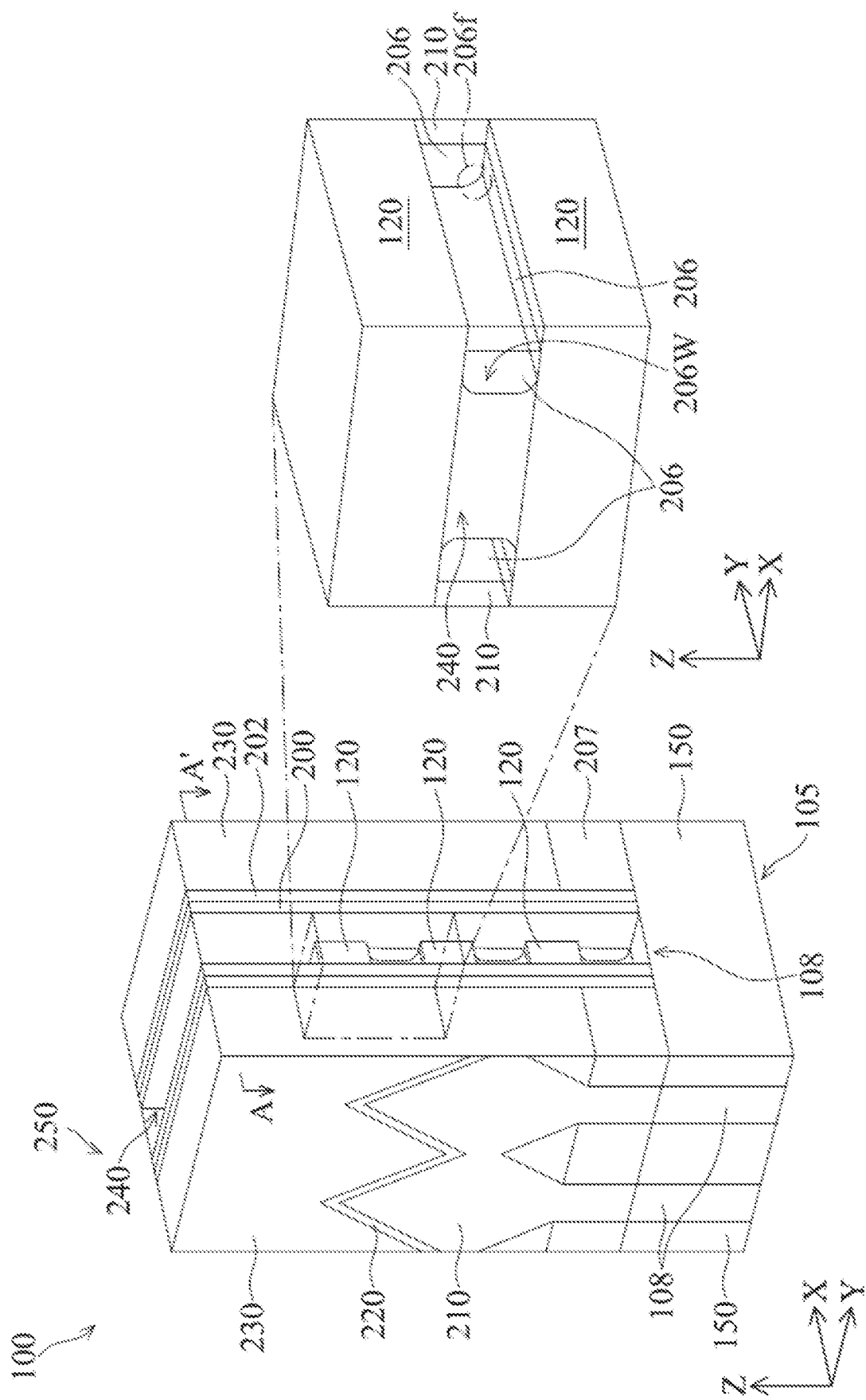

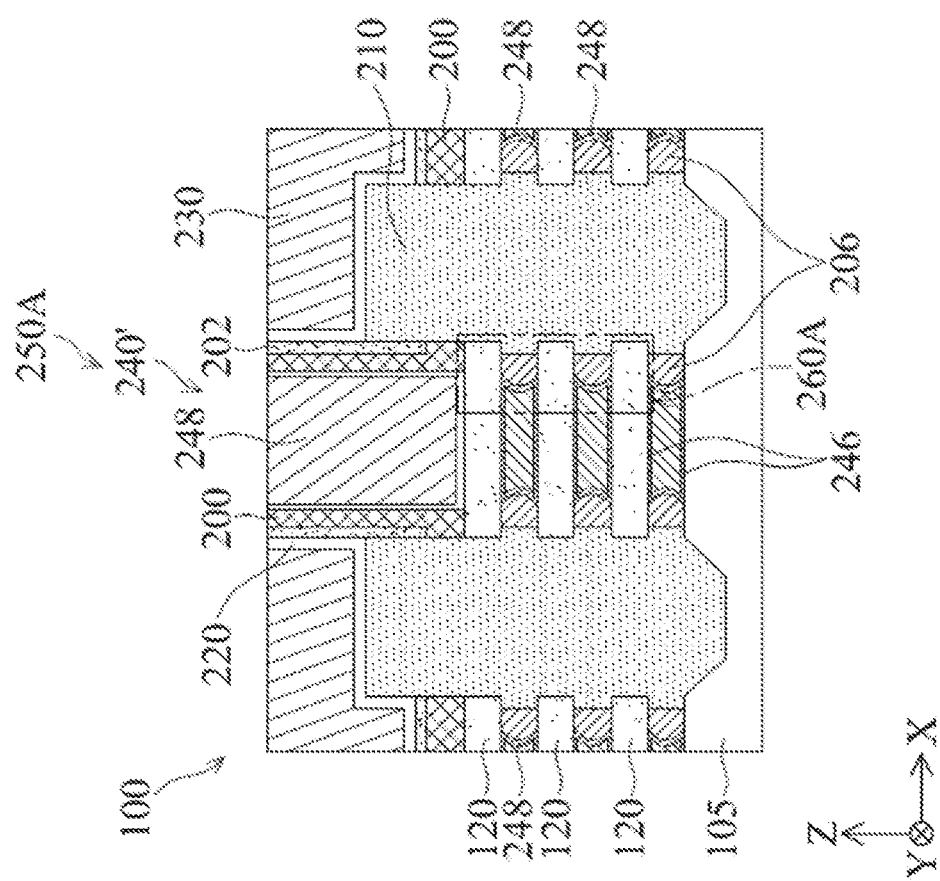
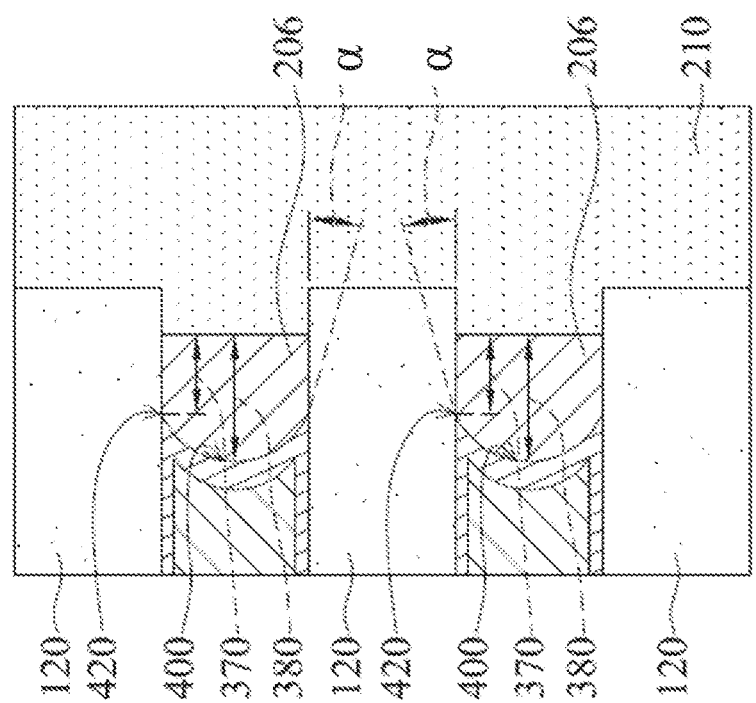
FIG. 14A
FIG. 14B

METHODS OF FORMING OF INNER SPACER STRUCTURE USING SEMICONDUCTOR MATERIAL WITH VARIABLE GERMANIUM CONCENTRATION

PRIORITY DATA

This application is a continuation application of U.S. patent application Ser. No. 17/243,274, filed Apr. 28, 2021, the entirety of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, nano-sheet-based devices have been introduced in an effort to improve gate control by increasing gate-channel coupling, reduce OFF-state current, and reduce short-channel effects (SCEs). Nano-sheet-based devices include a plurality of suspended channel layers stacked together to form the transistor channels which are engaged by a gate structure. The nano-sheet-based devices are compatible with conventional complementary metal-oxide-semiconductor (CMOS) processes, allowing them to be aggressively scaled down while maintaining gate control and mitigating SCEs. However, conventional methods for nano-sheet-based transistors may suffer from poor electronic isolation between source/drain features and the gate structures, thereby failing to provide the desired reliability or performances. Therefore, although conventional nano-sheet-based devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a three-dimensional (3D) perspective view of an embodiment of a nano-sheet-based device of the present disclosure constructed according to some embodiments of the present disclosure.

FIG. 1B is an expanded 3D perspective view of a portion of a nano-sheet-based device of the present disclosure constructed according to some embodiments of the present disclosure.

FIGS. 3A, 4A, 5, 6, 7A, 8A, 9A, 10A, 11, 12, 13, 14A, and 15A are cross-sectional views of an embodiment of nano-sheet-based device of the present disclosure along the line A-A' in FIG. 1A constructed at various fabrication stages according to some embodiments of the present disclosure.

FIGS. 3B, 4B, 7B, 8B, 9B, 10B, 14B, and 15B are expanded cross-sectional views of the circled area of the embodiment of nano-sheet-based device of the FIGS. 3A, 4A, 7A, 8A, 9A, 10A, and 15A, constructed at various fabrication stages according to some embodiments of the present disclosure.

DETAILED DESCRIPTION

Figure 1C:
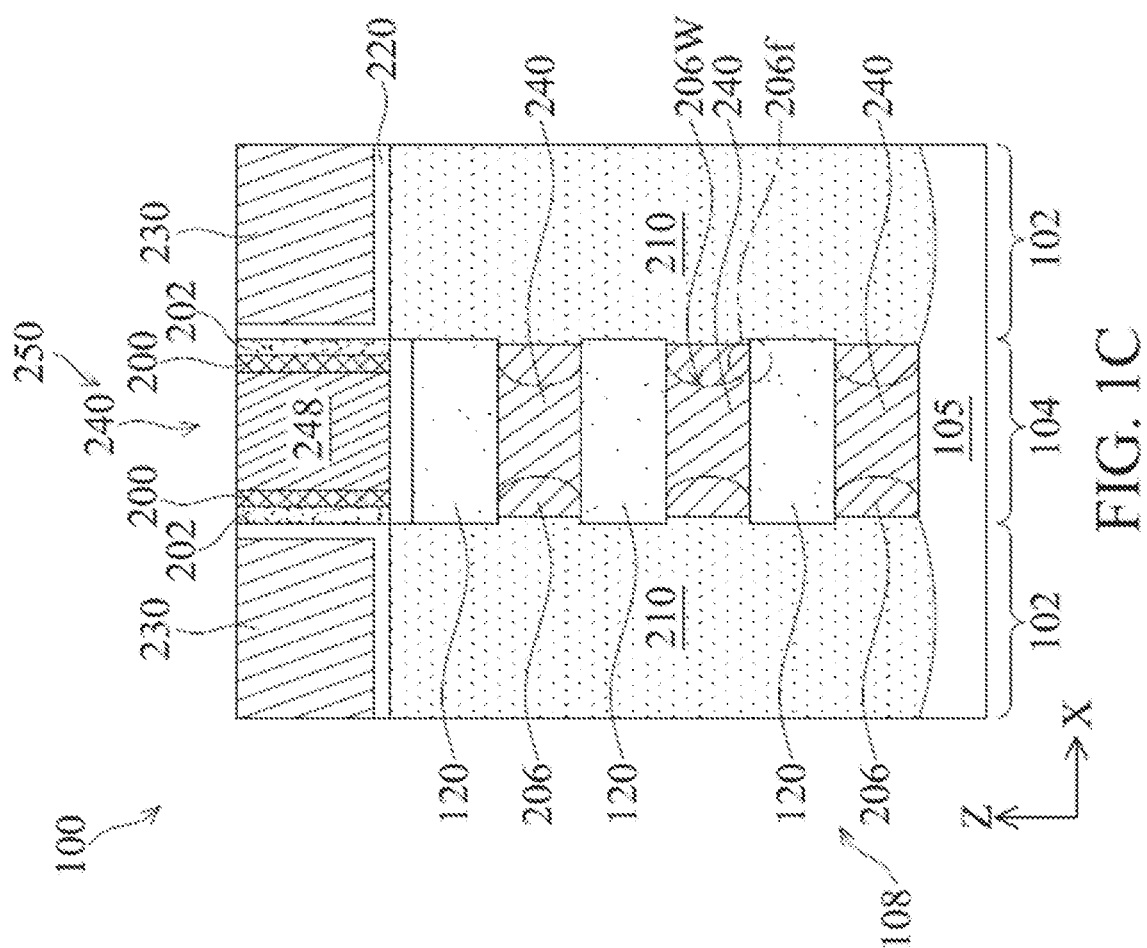
FIG. 1C is a cross-sectional view of an embodiment of a nano-sheet-based device of the present disclosure along the line A-A' in FIG. 1A constructed according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" may encompass the dimension range from 4.5 nm to 5.5 nm.

The present disclosure is generally related to ICs and semiconductor devices and methods of forming the same. More particularly, the present disclosure is related to vertically-stacked horizontally-oriented multi-channel transistors, such as nanowire transistors and nanosheet transistors. These types of transistors are sometimes referred to as gate-all-around (GAA) transistors, multi-bridge-channel (MBC) transistors, or some other names. In the present disclosure, they are broadly referred to as nano-sheet-based transistors (or devices). A nano-sheet-based device includes a plurality of suspended channel layers stacked one on top of another and engaged by a gate structure. The channel layers of a nano-sheet-based device may include any suitable shapes and/or configurations. For example, the channel layers may be in one of many different shapes, such as wire (or nanowire), sheet (or nanosheet), bar (or nano-bar), and/or other suitable shapes. In other words, the term nano-sheet-based devices broadly encompasses devices having channel layers in nanowire, nano-bars, and any other suitable shapes. Further, the channel layers of the nano-sheet-based devices may engage with a single, contiguous gate structure, or multiple gate structures. The channel layers connect a pair of source/drain features, such that the charge carriers may flow from the source region to the drain region through the channel layers during the operation (such as when the transistors are turned on). Additionally, inner spacers are formed between the source/drain features and the gate structures such that the source/drain features may be shielded from the operations targeting the gate structure. The inner spacers may have varying lateral widths across the vertical dimension (such as the dimension perpendicular to the top surface of the substrate).

In some approaches, the inner spacers may have rounded sidewall surfaces, where the top and bottom portions of each inner spacers have significantly reduced lateral widths as compared to the middle portions. As the overall dimensions of the inner spacers reduce along with the scale-down of the device, those top and bottom portions of the inner spacers may become too thin to provide sufficient protection for the source/drain features in subsequent processing. Damages may therefore occur to the source/drain features, which have been shown to degrade device performances. Conversely, to avoid such damages by increasing the overall dimensions of the inner spacers impedes the overall goal of scale-down. It is therefore a challenge to achieve the desired feature density without compromising feature integrity in these approaches. Accordingly, the present disclosure provides methods that form inner spacer structures that have less rounded (or more square-like) sidewall surfaces, such that the top and bottom portions of the inner spacers may maintain a relatively large lateral width for the purpose of maintaining feature integrity, while the middle portion of the inner spacers may have reduced lateral width to facilitate the scale-down effort. This results in overall performance improvements of the device. The nano-sheet based devices presented herein may be a complementary metal-oxide-semiconductor (CMOS) device, a p-type metal-oxide-semiconductor (PMOS) device, or an n-type metal-oxide-semiconductor (NMOS) device. One of ordinary skill may recognize other examples of semiconductor devices that may benefit from aspects of the present disclosure.

An example nano-sheet-based transistor 100 (or nano-sheet-based device 100, or transistor 100, or device 100) is illustrated in FIGS. 1A and 1B. FIG. 1A is a three-dimensional (3D) perspective view of an embodiment of the device 100 of the present disclosure. FIG. 1B is an expanded 3D view of the circled region of the device 100 in FIG. 1A. FIG. 1C is a cross-sectional view of the device 100 of FIG. 1A along the line A-A' in FIG. 1A. As illustrated, the device 100 includes a semiconductor substrate 105 (or hereinafter referred to as substrate 105). Fin structures (or fins), such as fin structures 108, are formed over the substrate 105, each extending lengthwise horizontally in an X-direction and separated from each other horizontally in a Y-direction. The X-direction and the Y-direction are horizontal directions that are perpendicular to each other, and that the Z-direction is a vertical direction that is orthogonal (or normal) to a horizontal XY plane defined by the X-direction and the Y-direction. The substrate 105 may have its top surface parallel to the XY plane.

The fin structures 108 each have a source region 102, a drain region 102 (collectively, source/drain regions 102) disposed along the X-direction and spaced away from each other. Epitaxial source/drain features 210 are formed in the source/drain regions 102 of the fin structures 108. The fin structures 108 each further have a channel region 104 disposed between and connecting the source and drain regions 102. A stack of suspended semiconductor layers 120 (also interchangeably referred to as "semiconductor layers 120" or "channel layers 120") are formed in the channel region 104 connecting the epitaxial source/drain features 210; and the stack extends vertically (e.g. along the Z-direction) from the substrate 105. The suspended semiconductor layers 120 may each be in one of many different shapes, such as wire (or nanowire), sheet (or nanosheet), bar (or nano-bar), and/or other suitable shapes, and may be spaced away from each other. The semiconductor layers 120 may each engage with a single, contiguous gate structure 250. The gate structure 250 includes a metal gate stack and gate spacers layers 200 on both sides of the metal gate stack, and optionally gate spacer layers 202 on two sides of the gate spacer layers 200. The device 100 further includes inner spacers 206 formed between the gate structures 250 and the epitaxial source/drain features 210. The inner spacers 206 may have a sidewall surface 206w. Furthermore, the sidewall surface 206w includes a footing region 206f. As described in detail later, the sidewall surface 206w is engineered to have a reduced curvature as compared to other approaches, and that the footing region 206f has a sidewall surface that is less canted from the vertical direction (or the Z-direction) as compared to other approaches. Note that the metal gate stack is illustrated as a transparent feature in FIGS. 1A and 1B in order to illustrate the features (such as the semiconductor layers 120) that the metal gate stacks cover. Moreover, FIGS. 1A-1C do not depict details of the metal gate stack for simplicity. Those details are described in later figures.

The device 100 further includes isolation features 150 within or over the substrate 105, separating adjacent fin structures 108 from each other. The isolation features 150 may be shallow trench isolation (STI) features or any other suitable isolation structures. The device 100 further includes interlayer dielectric (ILD) layer 230 over the epitaxial source/drain features 210, and contact etch stop layers 220 between the epitaxial source/drain features 210 and the ILD layer 230. Device 100 may include other suitable features, that have been omitted for simplicity and conciseness.

Figure 2A:
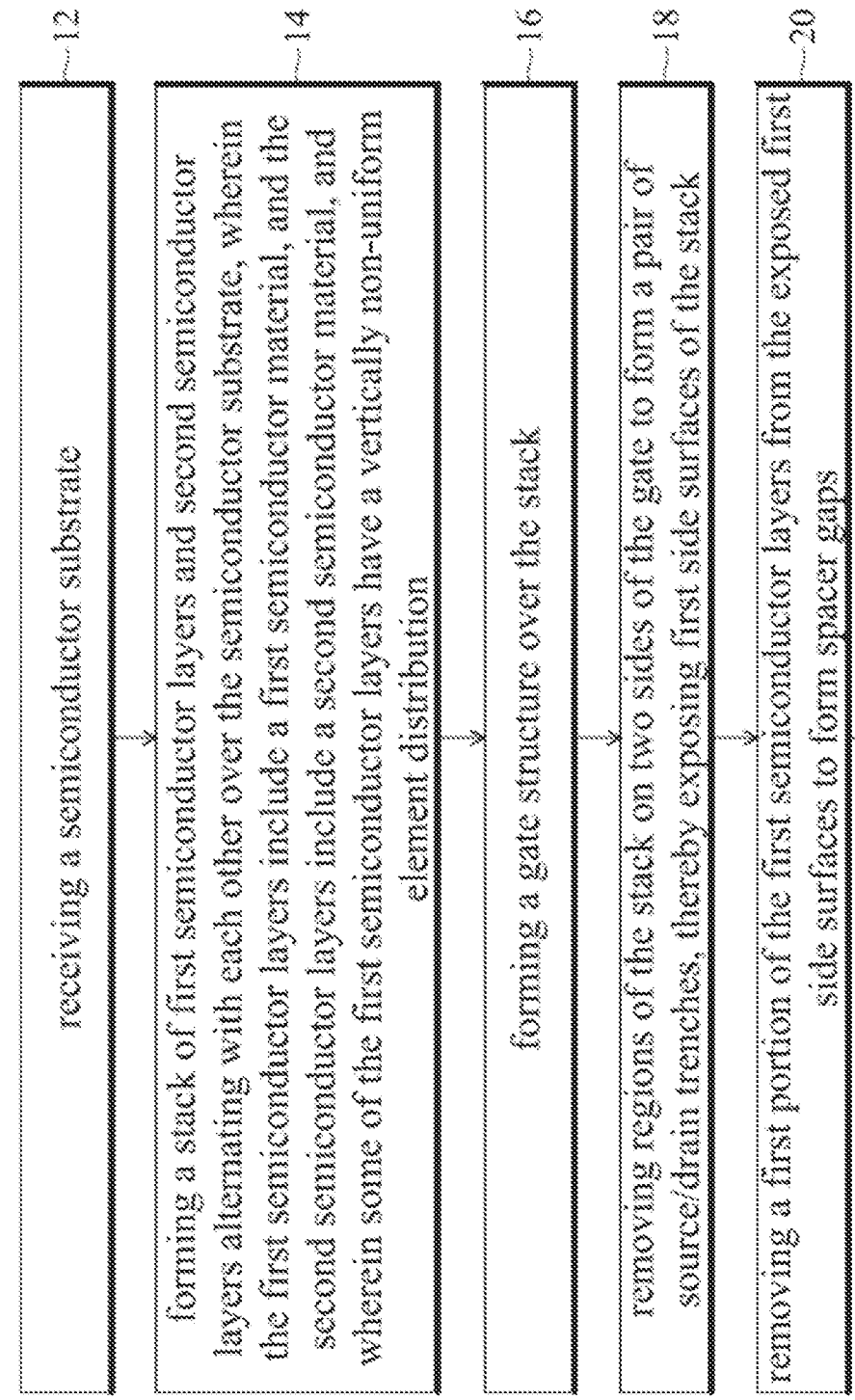
FIGS. 2A-2B are a flow chart of a method for fabricating a nano-sheet-based device of the present disclosure according to some embodiments of the present disclosure.
Figure 2B:
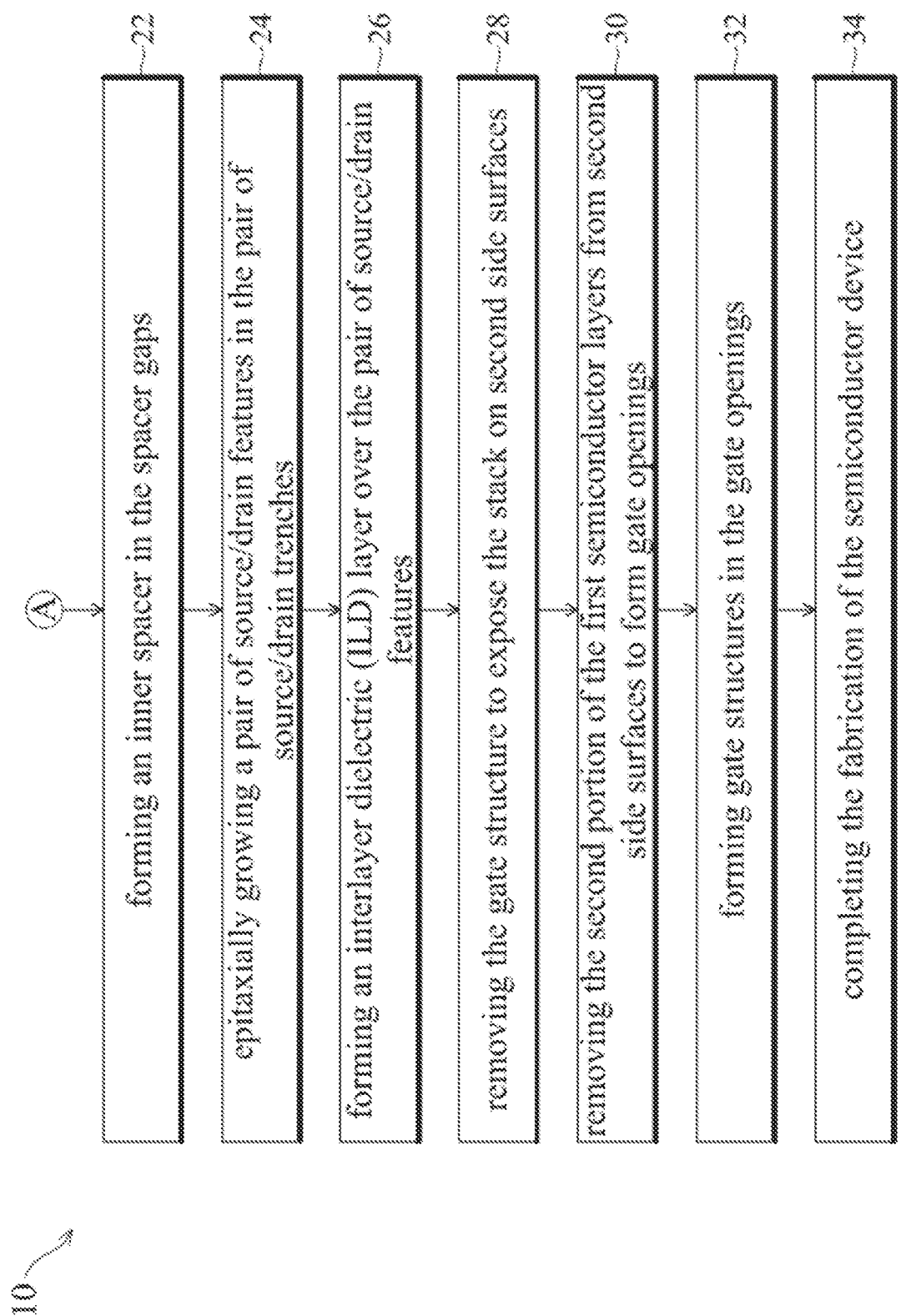

FIGS. 2A-2B illustrate a flow chart for an embodiment of a method 10 for fabricating a device 100 of the present disclosure. FIGS. 3A, 4A, 5, 6, 7A-10A, 11, 12, 13, 14A, and 15A are cross-sectional views of the device 100 along the line A-A' in FIG. 1A constructed at various fabrication stages of the method 10. FIGS. 3B, 4B, 7B-10B, 14B, and 15B, are expanded cross-sectional views of the circled area of the device 100 of the FIGS. 3A, 4A, 7A-10A, 14A, and 15A, respectively, constructed at various fabrication stages of the method 10. FIG. 7C is an expanded 3D view of the circled region of the device 100 in FIG. 7A.

Figures 3A, 3B:
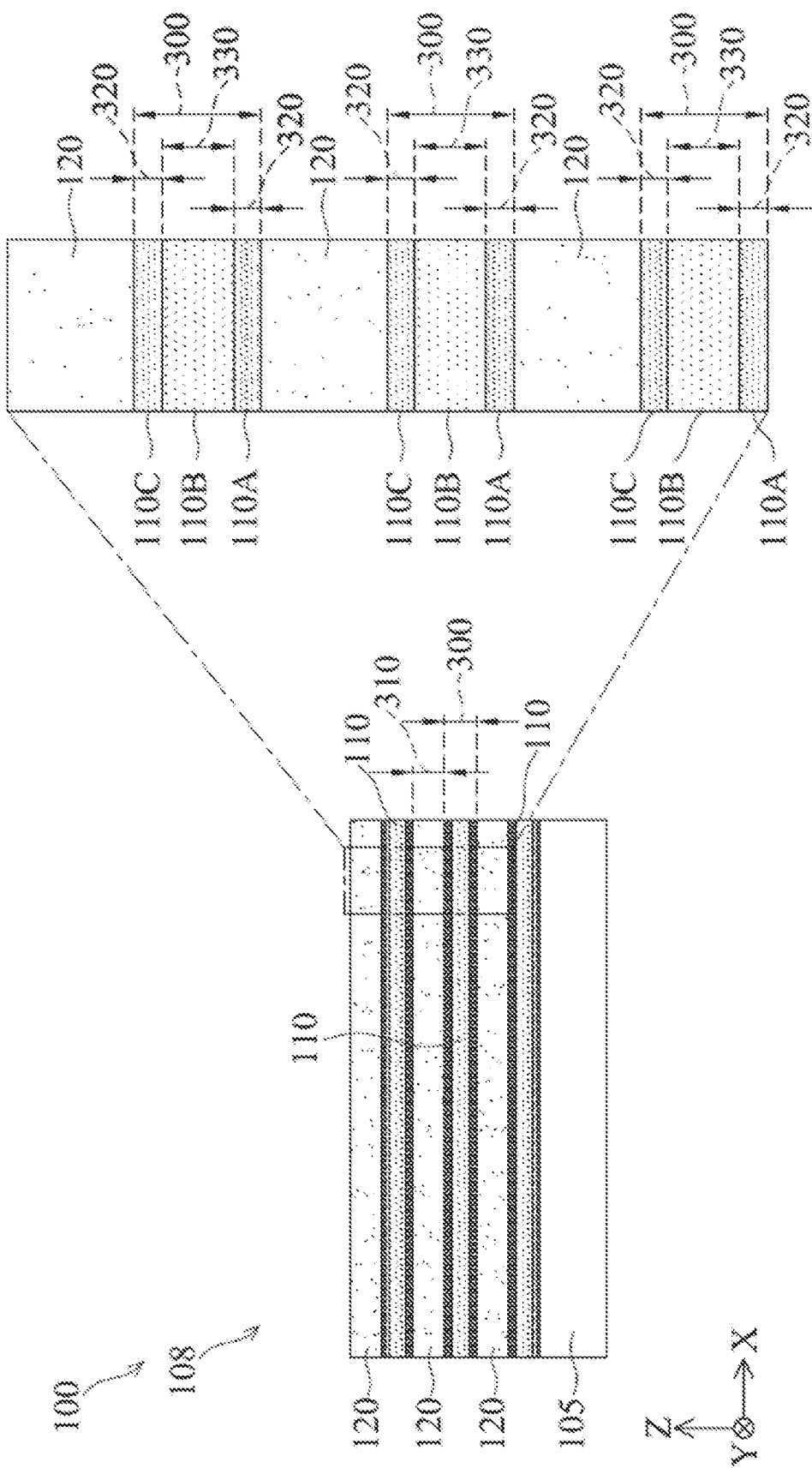

Referring to block 12 of FIG. 2A and FIG. 3A, the device 100 includes a substrate 105. The substrate 105 contains a semiconductor material, such as bulk silicon (Si), germanium (Ge), silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 105 may also include a semiconductor-on-insulator substrate, such as Si-on-insulator (an), SiGe-on-insulator (SGOI), Ge-on-insulator (GM) substrates.

Referring to block 14 of FIG. 2A and FIGS. 3A, 3B, stacks of semiconductor layers are formed over the substrate 105. The stacks of semiconductor layers include semiconductor layers 110 and semiconductor layers 120 alternating with each other. For example, a semiconductor layer 110 is formed over the substrate 105; a semiconductor layer 120 is formed over the semiconductor layer 110; and another semiconductor layer 110 is formed over the semiconductor layer 120, so on and so forth. In some embodiments, epitaxial growth of semiconductor layers 110 and semiconductor layers 120 is achieved by a molecular beam epitaxy (MBE) process, a chemical vapor deposition (CVD) process, a metalorganic chemical vapor deposition (MOCVD) process, other suitable epitaxial growth process, or combinations thereof. In such embodiments, semiconductor layers 110 and semiconductor layers 120 can be referred to as epitaxial layers.

In some embodiments, the deposition and growth of the semiconductor layers 110 and 120 implement precursor gases that include elements of the respective semiconductor layers. For example, the deposition of a silicon (Si) semiconductor layer may implement Si-containing precursors such as silicon tetrachloride ($SiCl_4$), silicon dichlorosilane ($SiH_2Cl_2$), trichlorosilane ($SiHCl_3$), silane ($SiH_4$), other suitable Si-containing precursors, or combinations thereof. Moreover, the deposition of a silicon germanium (SiGe) semiconductor layer may implement a Si precursor, such as those listed above, and a germanium (Ge) precursor, such as isobutylgermane, alkylgermanium trichlorides, and dimethylaminogermanium trichloride, other suitable Ge-containing precursors, or combinations thereof. As described in detail later, SiGe semiconductor layers (or sublayers) may have different Si concentrations (such as Si atomic percentages) and different Ge concentrations (such as Ge atomic percentages). This may be controlled by a flow rate ratio of the Si precursor flow rate to the Ge precursor flow rate. For example, to achieve a SiGe semiconductor layer where 50% of the total atoms are Si, and 50% of the total atoms are Ge, the flow rate ratio of the silicon precursor and the germanium precursor may be set at 1:1. For example, to achieve a SiGe semiconductor layer where 75% of the total atoms are Si and 25% of the total atoms are Ge, the flow rate ratio of the silicon precursor and the germanium precursor may be set at 3:1. As described in detail later, in some embodiments, the semiconductor layers 110 and 120 may have uniform compositions. Accordingly, the flow rates of the precursor gases remain unchanged during the epitaxy process. In some other embodiments, the semiconductor layers 110 and 120 may have varying compositions. Accordingly, the flow rates of the precursor gases vary as the deposition and growth process proceeds. Additional reactive gas or carrying gas may also be implemented to facilitate the deposition or growth of the semiconductor layers.

As described further below, semiconductor layers 120 or portions thereof form channel regions of device 100, and semiconductor layers 110 are replaced by other features of the device. In the depicted embodiment, the semiconductor layer stack includes three semiconductor layers 110 and three semiconductor layers 120, configured to form three semiconductor layer pairs disposed over substrate 105. After undergoing subsequent processing, such configuration will result in the device 100 having three channel layers (or channels). However, the present disclosure contemplates embodiments where semiconductor layer stack includes more or fewer semiconductor layers, for example, depending on a number of channels desired for device 100 or design requirements of device 100. For example, the semiconductor layer stack can include two to ten semiconductor layers 110 and two to ten semiconductor layers 120. In the depicted embodiment, the semiconductor layers 110 each have a substantially uniform thickness, referred to as the thickness 300, while the semiconductor layers 120 each have a substantially uniform thickness, referred to as the thickness 310. The thickness 310 may be the same as, or different from, the thickness 300. The thickness 300 and thickness 310 are chosen based on fabrication and/or device performance considerations for device 100. For example, thickness 310 can be configured to achieve desired thickness of channels of device 100, thickness 300 can be configured to define a desired distance (or gap) between adjacent channels of device 100 (e.g., between semiconductor layers 120). Both thickness 300 and thickness 310 can be configured to achieve desired performance of device 100. In some embodiments, thickness 300 may be about 3 nm to about 15 nm; and thickness 310 may be about 3 nm to about 15 nm.

The semiconductor layers 110 are configured to include materials different from that of the semiconductor layers 120 in order to achieve etching selectivity during subsequent processing. Generally, layers with different materials present different etch rates in a particular etching chemical (or chemical etchant, or etchant) in absence of other environmental factors (such as those described later). These etch rates are referred to herein as the intrinsic etch rates. As described in detail later, difference in intrinsic etch rates may also arise from layers having different material compositions (such as constituent atomic percentages) even though the materials (such as elements) are identical. However, such differences in intrinsic etch rates tend to be smaller than those caused by material differences. The intrinsic etch rates are determined by the layer materials (or material compositions), the etching chemical, and the etching parameters. Additionally, as described later, etch rates of particular layers may be perturbed (or changed) by environmental factors such that differences in actual etch rates are reduced or increased as compared to differences in intrinsic etch rates. In some embodiments, semiconductor layers 110 have a first etch rate (or first etch rates, as described in detail below) to an etching chemical; and semiconductor layers 120 have a second etch rate to the etching chemical, where the second etch rate is less than the first etch rate. In the depicted embodiment, semiconductor layers 110 and semiconductor layers 120 include different materials, for example, the semiconductor layers 110 contain silicon germanium (SiGe), while the semiconductor layers 120 contain silicon (Si). The compositions of the etching chemical and the etching parameters are configured to provide a Si etch rate that is less than a SiGe etch rate.

In some embodiments, the semiconductor layers 110 each includes a multi-sublayer structure, for example, a three-sublayer structure. In the depicted embodiments of FIGS. 3A and 3B, the semiconductor layers 110 each includes a sublayer 110A formed on a semiconductor layer 120 (or, for the lowest semiconductor layer 110, on the substrate 105), a sublayer 110B formed on the sublayer 110A, and a sublayer 110C formed on the sublayer 110B. The sublayers 110A, 110B, and 110C each include a same material (here, SiGe), but with different constituent atomic percentages (such as Ge atomic percentages and Si atomic percentages). This allows different etch rates to be achieved between the sublayers 110A and 110B, and between the sublayers 110B and 110C. As described in detail below, such etch rate differences allow the profile of the sidewall surfaces 206w (see FIG. 1B) of the subsequently formed inner spacers to be controlled and modulated across the thickness dimensions of the sublayers 110A, 110B, and 110C (such as along the Z-direction), which results in improved device performances. Meanwhile, etch rate differences arising out of differences in atomic percentages are generally much less pronounced than etch rate differences arising out of different materials. Accordingly, the etch rate of the semiconductor layers 120 remain much less than etch rates of each of the sublayers 110A, 110B, and 110C. The integrity of the semiconductor layers 120 are thus maintained.

The proper constituent atomic percentages may be determined based on criteria explained in detail later. In some embodiments, the sublayers 110A may have a Ge atomic percentage of about 20% to about 60%; the sublayers 110B may have a Ge atomic percentage of about 5% to about 50%; the sublayer 110C may have a Ge atomic percentage of about 20% to about 60%. Similarly, sublayers 110A and 110C may have a Si atomic percentage different from sublayer 110B. For example, the sublayer 110A may have a Si atomic percentage of about 40% to about 80%; the sublayer 110B may have a Si atomic percentage of about 50% to about 95%; the sublayer 110C may have a Si atomic percentage of about 40% to about 60%. In some embodiments, the compositions of the sublayers 110A are similar to or about the same as the compositions of the sublayers 110C, but are different from the composition of the sublayers 110B. In some embodiments, a difference (Δ1) between the Ge atomic percentage in the sublayer 110A (or the sublayer 110C) ("Ge atom % of 110A/C") and the Ge atomic percentage in the sublayer 110B ("Ge atom % of 110B"), as measured against the total atomic numbers of the respective semiconductor sublayer, is about 5% to about 15% (i.e., Δ1=Ge atom % of 110A/C−Ge atom % of 110B=about 5% to about 15%). In some embodiments, a ratio (γ1) of the Ge atomic percentage in the sublayer 110A (or the sublayer 110C) to the Ge atomic percentage in the sublayer 110B is about 1.1 to about 7.0 (i.e., γ1=Ge atom % of 110A/C:Ge atom % of 110B=about 1.1 to about 7.0). For example, the ratio (γ1) may be from about 1.2 to about 3.0 (i.e., γ1=Ge atom % of 110A/C:Ge atom % of 110B=about 1.2 to about 3.0). If the difference Δ1 is too small (such as less than about 5%), or the ratio γ1 is too small (such as less than about 1.1), there may be insufficient difference between the intrinsic etch rates of the sublayers such that the ability to modulate the profiles of the inner spacers may be limited. If the difference Δ1 is too large (such as greater than about 15%), or the ratio γ1 is too large (such as greater than about 7.0), epitaxy dislocations or stacking faults may be formed at the interface of the sublayers, which may degrade device performance. In some embodiments, the sublayers 110A may have a Ge atomic percentage of about 30% to about 50%; the sublayers 110B may have a Ge atomic percentage of about 15% to about 35%; the sublayer 110C may have a Ge atomic percentage of about 30% to about 50%.

The sublayers 110A, 110B, and 110C may have the same or different thicknesses. The sum of the thicknesses of the sublayers 110A, 110B, and 110C equals the thickness 300 of the semiconductor layer 110. In the depicted embodiment, the sublayers 110A and the sublayers 110C have the same thickness, referred to as thickness 320, and the sublayer 110B has a thickness different from the thickness 320, referred to as the thickness 330. In some embodiments, the thickness 330 is greater than the thickness 320. In some embodiments, the thickness 320 may be about 0.5 nm to about 2.5 nm; and the thickness 330 may be about 2.5 nm to about 5 nm. In some embodiments, a thickness ratio (γ2) of the thickness 320 to the thickness 330 is about 0.1 to about 1. As described above, the material composition differences allow modulation of the sidewall profiles of the inner spacers across the thickness dimension of the sublayers 110A, 110B, and 110C. If the ratio γ2 is too small, such as smaller than 0.1, the contribution of the sublayers 110A and 110C to the overall sidewall profile of the inner spacers may be too small to cause any meaningful improvements. In other words, any issues observed in a single layer semiconductor layer 110 will be manifested in the sublayer 110B itself. Conversely, if the ratio γ2 is too large, such as greater than 1, the beneficial effect of the different material compositions may be diluted across the thickness of the sublayers 110A and 110C. In other words, any issues observed in a single layer semiconductor layer 110 will be manifested in the sublayers 110A and 110C themselves.

As described above, the formation of the semiconductor layers 110 and 120 may implement precursor gases. In the depicted embodiments, the semiconductor layers 120 include a uniform Si material. Accordingly, the precursor gas implemented for the formation of the semiconductor layers 120 includes a Si precursor gas or Si precursor gases. Moreover, the semiconductor layers 110 include SiGe where atomic percentages of Si and Ge vary in different sublayers 110A, 110B, and 110C. Accordingly, the precursor gases implemented during the formation of the semiconductor layers 110 may include a Si precursor gas and a Ge precursor gas where the flow rates are adjusted throughout the deposition or the growth process, to provide different flow rate ratios that result in different atomic percentages in different sublayers. For example, the flow rate of the Ge precursor gas and the flow rate of the Si precursor gas are first adjusted such that the flow rate ratio provides for (or matches) the target ratio between the Ge atomic percentage and the Si atomic percentage for the sublayers 110A. When the target thickness of the sublayer 110A is reached, the flow rates of the Ge precursor gas and the Si precursor gas are adjusted such that the flow rate ratio provides for (or matches) the target ratio between the Ge atomic percentage and the Si atomic percentage for the sublayers 110B. And when the target thickness of the sublayer 110B is reached, the flow rates of the Ge precursor gas and the Si precursor gas are further adjusted such that the flow rate ratio provides for (or matches) the target ratio between the Ge atomic percentage and the Si atomic percentage for the sublayers 110C. In the depicted embodiments, this leads to a first decrease in the flow rate ratio of the Ge precursor gas to the Si precursor gas, and then an increase of the flow rate ratio. For example, the flow rate ratio is maintained at $r_A$ during the formation of the sublayers 110A, changed to $r_B$ during the formation of the sublayer 110B, and further changed to $r_C$ during the formation of the sublayers 110C. The ratios $r_A$, $r_B$, and $r_C$ do not change during the course of the deposition or growth. In some embodiments, a ratio of $r_A$ to $r_B$ and $r_C$ to $r_B$ may be about 1.1 to about 7.0, such as about 1.2 to about 3.0, so as to provide the desired ratio of Ge atomic percentage ratios between the sublayers as described above. In some embodiments, the changes in the flow rate ratios may be abrupt, resulting in the sublayers 110A, 110B, and 110C having clear boundaries.

While the above disclosure describes the sublayers 110A, 110B, and 110C each include SiGe and varying only in constituent atomic percentages, they may alternatively include different materials, provided that those materials provide different etch rate amongst themselves, which are also substantially different from the etch rate of the Si material of the semiconductor layers 120.

Figures 4A, 4B:
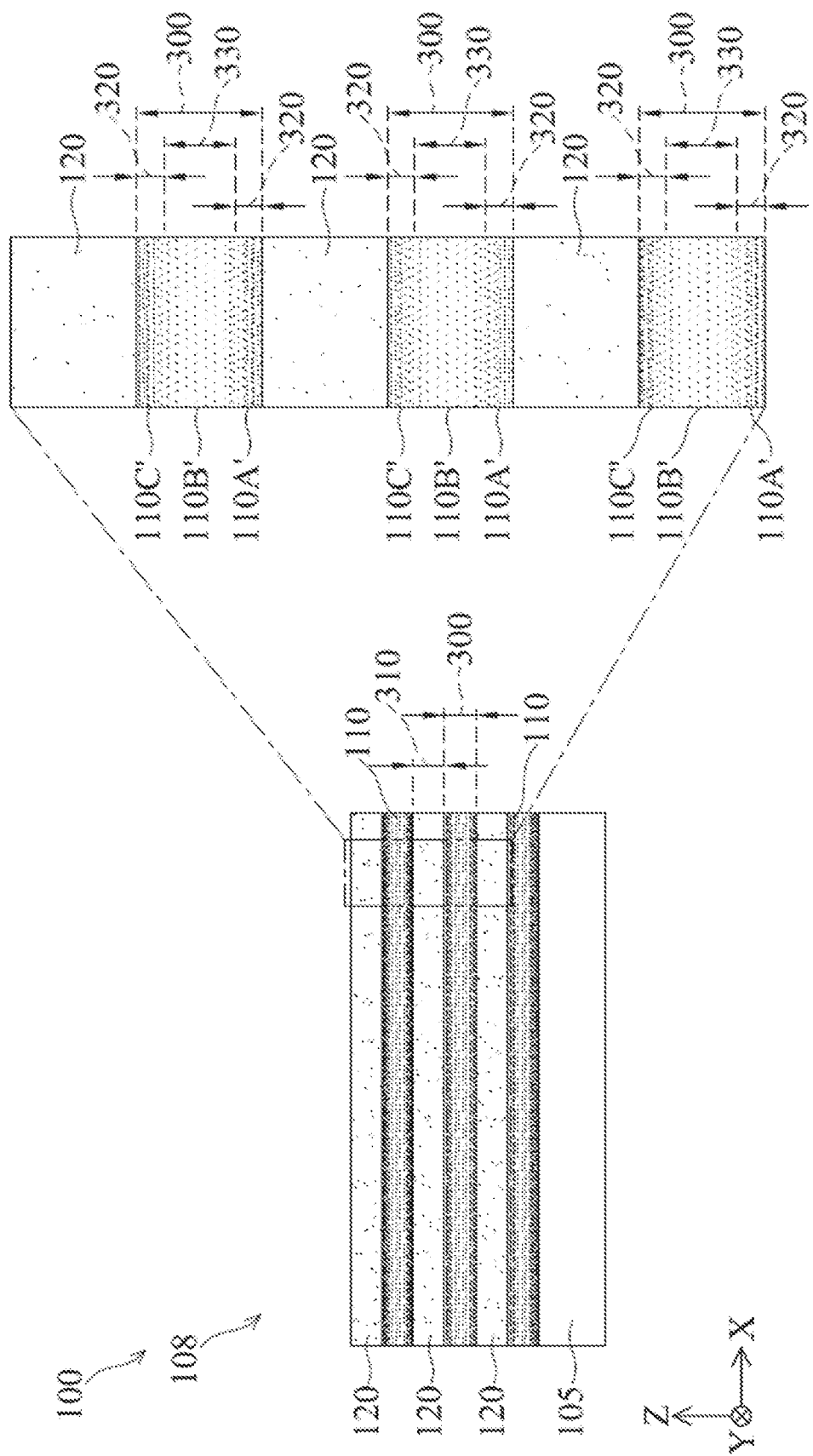

FIGS. 3A and 3B above present one embodiment of the method 10 of the present disclosure to achieve the control over the sidewall profiles of subsequently formed inner spacers. Alternatively, similar control may be achieved by engineering the semiconductor layers 110 to be a single layer having a gradient structure. Referring to FIGS. 4A and 4B, the single layer semiconductor layers 110 each includes a region 110A' over a semiconductor layer 120 (or for the lowest semiconductor layer 110, over the substrate 105), a region 110B' over the region 110A', and a region 110C' over the region 110B'. The regions 110A', 110B', and 110C' may each have varying compositions throughout their respective thickness dimensions (such as along the Z-direction). In some embodiments, the regions 110A', 110B', and 110C' have the same thicknesses 320, 330, and 320 as the sublayers 110A, 110B, and 110C (FIG. 3B), respectively. Moreover, the composition may vary continuously and gradually across the adjacent regions, such as from the region 110A' to the region 110B', and from the region 110B' to the region 110C'. Furthermore, the variations across an interface between two regions may be consistent (such as in a same direction) as the variation within the regions close to the interface. In some embodiments, boundaries (or interfaces) between the regions may be defined by the plane at which an atomic percentage of a constituent atom (such as Ge) changes fastest against the Z-direction. In other embodiments, however, there may be less clear boundaries between the first region 110A' and the second region 110B', or between the second region 110B' and the third region 110C'. In such embodiments, the regions 110A', 110B', and 110C' are only assigned based on the thickness 320 and thickness 330 to aid the descriptions. FIGS. 4A and 4B may use the same reference numerals as those of FIGS. 3A and 3B to describe similar features for the purpose of simplicity and clarity.

In the depicted embodiments, the region 110A', the region 110B', and the region 110C' each includes silicon germanium. Moreover, the average composition (for example, the average Ge atomic percentage and the average Si atomic percentage) of the region 110A' resembles that of the sublayer 110A of FIGS. 3A and 3B. Accordingly, the region 110A' may include an average Ge atomic percentage of about 20% to about 60% and an average Si atomic percentage of about 40% to about 80%. The average composition of the region 110B' resembles that of the sublayer 110B of FIGS. 3A and 3B. Accordingly, the region 110B' may include an average Ge atomic percentage of about 5% to about 50% and an average Si atomic percentage of about 50% to about 95%. The average composition of the region 110C' resembles that of the sublayer 110C of FIGS. 3A and 3B. Accordingly, the region 110C' may include an average Ge atomic percentage of about 20% to about 60% and an average Si atomic percentage of about 40% to about 80%. In some embodiments, there is a parabolic distribution of the Ge atomic percentage within the semiconductor layer 110 with the vertex (lowest point) of the distribution being located at the mid-height of the semiconductor layer 110, and the highest point of the distribution being located at the interfaces of the semiconductor layer 110 with the semiconductor layers 120 (or the substrate 105). In addition, there is another parabolic distribution of Si atomic percentage that is opposite to the distribution of the Ge atomic percentage.

The formation of the gradient structure of the semiconductor layer 110 generally resembles that described above with respect to FIGS. 3A and 3B. For example, the flow rate of the Ge precursor gas and the Si precursor gas are adjusted such that the flow rate ratio provides for the target ratio of the Ge atomic percentage to the Si atomic percentage for the particular region being formed. As the deposition or growth transitions from one region to another, the flow rates are adjusted such that the flow rate ratio changes accordingly. This similarly leads to first decrease of the flow rate ratio of the Ge precursor gas to the Si precursor gas, and then increase of the flow rate ratio. Unlike the embodiment described with respect to FIGS. 3A and 3B, the flow rate ratios are not changed abruptly at the interfaces between sublayers, but rather continuously and gradually within regions and across the regions. This results in a gradient structure where constituent atomic percentages changes continuously and gradually. For example, during the forming of the region 110A', the flow rate ratio $r_A$ of the Ge precursor gas to the Si precursor gas continuously and gradually decreases. At the conclusion of the formation of the region 110A', the flow rate ratio $r_A$ continuously and gradually decreases so the process transitions into the forming of the region 110B'. During the forming of the region 110B', the flow rate ratio $r_B$ first continuously decreases until a minimum is reached at the mid-height of the region 110B'. Then, the flow rate ratio $r_B$ gradually and continuously increases until the desired thickness of the region 110B' is reached. During the formation of the region 110C', the flow rate ratio $r_C$ continuously increases until the desired thickness of the region 110C' is reached. Therefore, the flow rate ratios $r_A$ and $r_B$ are equal at the interface between the regions 110A' and 110B', and the flow rate ratios $r_B$ and $r_C$ are equal at the interface between the regions 110B' and 110C'. In some embodiments, the changes of the flow rate ratios against the thickness dimension of the semiconductor layer 110 may follow a parabolic curve, such that the Ge atomic percentage is at the highest at the interface with the semiconductor layers 120 (or the substrate 105) and at the lowest at the mid-height of the semiconductor layer 110. In some embodiments, the curve representing the change of the flow rate ratios against the thickness dimension before and after reaching the mid-height of the regions 110B' may form a mirror image to each other.

The configuration of FIGS. 4A and 4B is described above as the semiconductor layer 110 having a gradient composition. Alternatively, this configuration may also be viewed as the semiconductor layer 110 having an infinite number of sublayers, each sublayer overlaying another sublayer, with the lowest sublayer overlaying the semiconductor layer 120 (or the substrate 105 for the lowest semiconductor layer 110), and with the highest sublayer on a bottom surface of another semiconductor layer 120. Accordingly, the configuration in FIGS. 4A and 4B represents the upper limit of the number of sublayers that may be present within the semiconductor layer 110. In that sense, the configuration in FIGS. 3A and 3B represents the lower limit of the number of sublayers that may be present within the semiconductor layer 110. In some embodiments, there may be any number of sublayers between these two limits (that is between three and infinite) that constitute the semiconductor layer 110. For example, there may be five sublayers within the semiconductor layer 110. In furtherance of the example, a first sublayer overlays the semiconductor layer 120 (or the substrate 105) and may have a first composition (such as a uniform or constant composition) of Si and Ge; a second sublayer overlays the first sublayer and may have a second composition of Si and Ge; a third sublayer overlays the second sublayer and may have a third composition of Si and Ge; a fourth sublayer overlays the third sublayer and may have a fourth composition of Si and Ge; and a fifth sublayer overlays the fourth sublayer and may have a fifth composition of Si and Ge. In some embodiments, the first Ge atomic percentage of the first sublayer is greater than the second Ge atomic percentage of the second sublayer, which is greater than the third Ge atomic percentage of the third sublayer. Moreover, the third Ge atomic percentage of the third sublayer is less than the fourth Ge atomic percentage of the fourth sublayer, which is less than the fifth Ge atomic percentage of the fifth sublayer.

For example, there may be six sublayers within the semiconductor layer 110. In furtherance of the example, a first sublayer overlays the semiconductor layer 120 (or the substrate 105) and may have a first composition (such as a uniform or constant composition) of Si and Ge; a second sublayer overlays the first sublayer and may have a second composition of Si and Ge; a third sublayer overlays the second sublayer and may have a third composition of Si and Ge; a fourth sublayer overlays the third sublayer and may have a fourth composition of Si and Ge; a fifth sublayer overlays the fourth sublayer and may have a fifth composition of Si and Ge; and a sixth sublayer overlays the fifth sublayer and may have a sixth composition of Si and Ge. In some embodiments, the first Ge atomic percentage of the first sublayer is greater than the second Ge atomic percentage of the second sublayer, which is greater than the third Ge atomic percentage of the third sublayer. The third Ge atomic percentage of the third sublayer may be about the same as the fourth Ge atomic percentage of the fourth sublayer. Moreover, the fourth Ge atomic percentage of the fourth sublayer is less than the fifth Ge atomic percentage of the fifth sublayer, which is less than the sixth Ge atomic percentage of the sixth sublayer. Alternatively, there may be any other number (greater than 2) of sublayers, such as four sublayers, seven sublayers, eight sublayers, etc.

The stacks of semiconductor layers described above (either as illustrated in FIGS. 3A and 3B, or alternatively as illustrated in FIGS. 4A and 4B) are patterned into a plurality of fin structures, for example, fin structures 108, such that they each have a width dimension along the Y-direction, a height dimension along the Z-direction, and each extending along and have a length dimension along the X-direction. The fin structures 108 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The fin structures 108 may have lateral widths that are the same between each other or different from each other.

Figure 5:
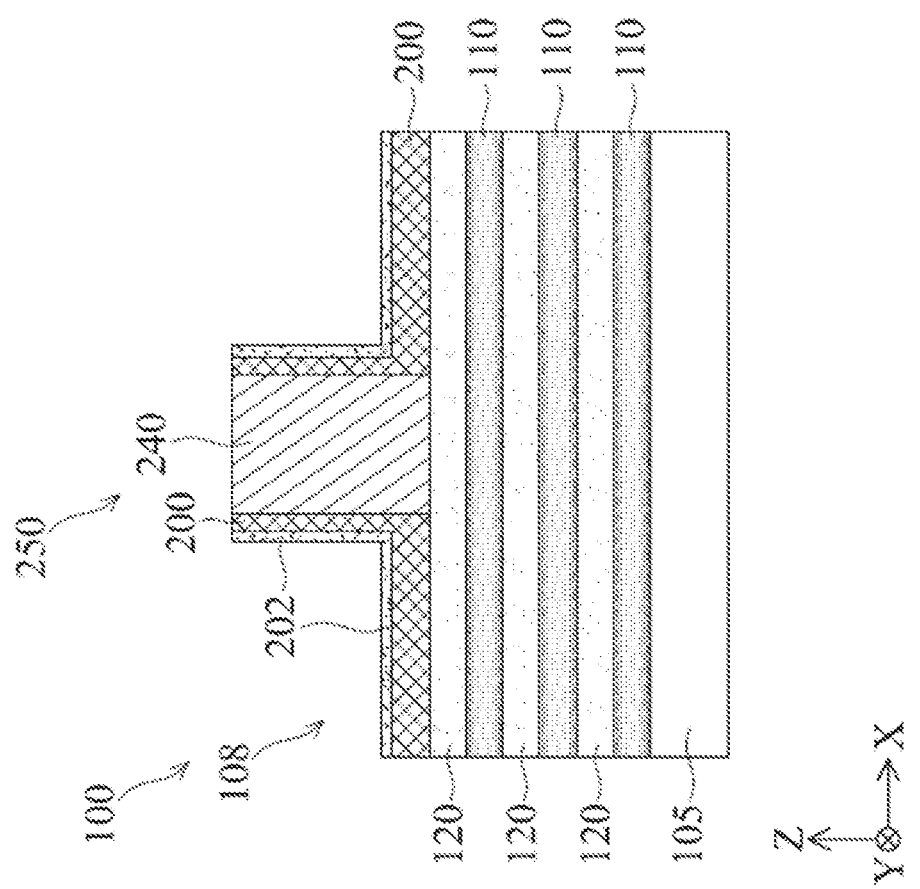
Figure 6:
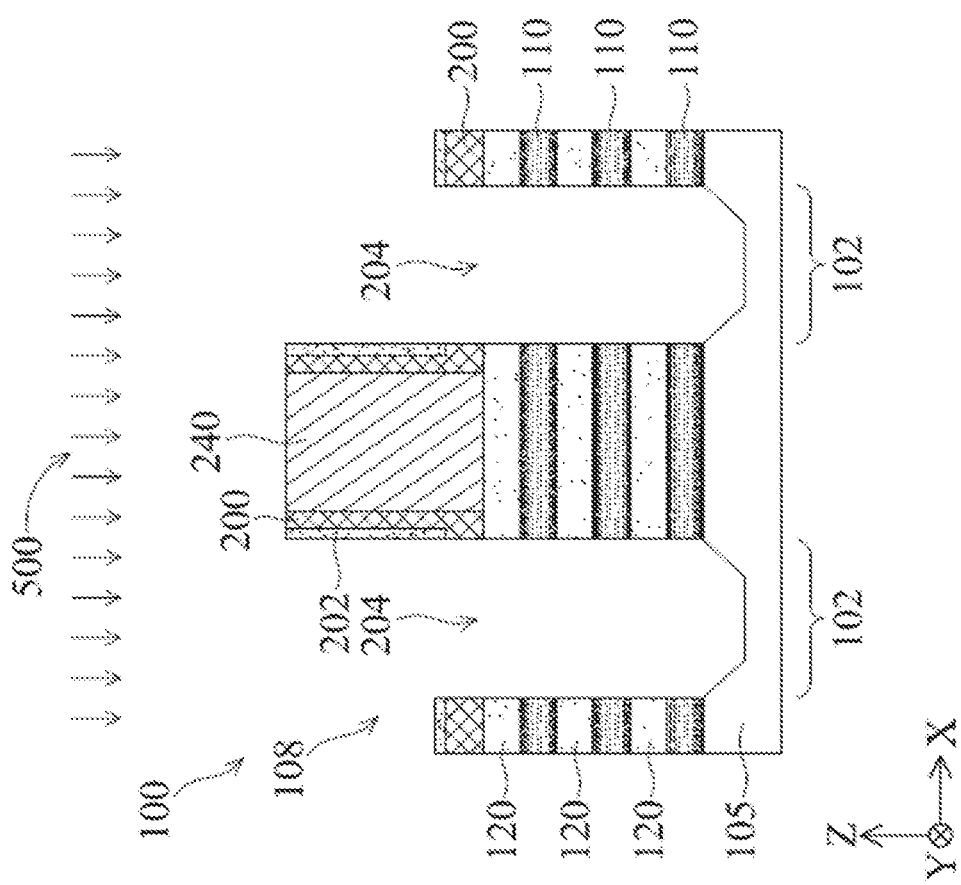

Referring to block 16 of FIG. 2A and FIG. 5, gate structures 250 are formed over a portion of each of the fin structures 108. In some embodiments, the gate structures 250 are also formed over the isolation features 150 in between adjacent fin structures. The gate structures 250 may be configured to extend lengthwise in parallel to each other, for example, each along the Y-direction. In some embodiments, the gate structures 250 each wrap around the top surface and side surfaces of each of the fin structures 108. The gate structures 250 includes dummy gate stacks 240 and gate spacers 200 and 202. The dummy gate stacks 240 may include polysilicon or any other suitable materials. In some embodiments, the gate structures 250 also include one or more mask layers (not shown), which are used to pattern the dummy gate stacks 240. The dummy gate stacks 240 may undergo a gate replacement process through subsequent processing to form metal gates, such as a high-k metal gate, as discussed in greater detail below. The dummy gate stacks 240 may be formed by a procedure including deposition, lithography, patterning, and etching processes. The deposition processes may include CVD, ALD, PVD, other suitable methods, and/or combinations thereof.

Gate spacers are formed on the sidewalls of the dummy gate stacks 240 and the top layer of the semiconductor layers 120. Gate spacers may include a single layer or a multi-layer structure. For example, in the depicted embodiment, a gate spacer layer 200 is formed over the top surface of the device 100, and a gate spacer layer 202 is formed over the gate spacer layer 200. The gate spacer layers 200 and 202 may each include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. In some embodiments, the gate spacer layers 200 and 202 may collectively has a thickness in the range of a few nanometers (nm). In some embodiments, the gate spacer layers 200 and 202 may be formed by depositing a spacer layer (containing the dielectric material) over the dummy gate stack 240, followed by an anisotropic etching process to remove portions of the spacer layer from the top surfaces of the dummy gate stacks 240. After the etching process, portions of the spacer layer on the sidewall surfaces of the dummy gate stacks 240 substantially remain and become the gate spacer layers 200 or 202. In some embodiments, the anisotropic etching process is a dry (e.g. plasma) etching process. Additionally or alternatively, the formation of the gate spacer layers 200 and 202 may also involve chemical oxidation, thermal oxidation, ALD, CVD, and/or other suitable methods.

Processing continues to form source/drain trenches for source/drain features. Referring to block 18 of FIG. 2A and FIG. 6, portions of the fin structure 108 adjacent to and exposed by the gate structures 250 (e.g. in the source/drain regions 102) are at least partially recessed (or etched away) by process 500 to form the source/drain trenches 204. Meanwhile, the portions of the fin structure 108 underneath the gate structures 250 remain intact. Additional mask elements (not shown) may also be employed to protect areas not designed to be removed during the process 500. In the depicted embodiment, the process 500 removes not only the exposed portions of fin structure 108, but also a portion of the underlying substrate 105. Accordingly, the source/drain trenches 204 extends below the top surface of the substrate 105. In some embodiments (not shown), the process 500 removes only the exposed portions of the fin structure 108, such that the top surface of the substrate 105 is exposed in the source/drain trenches 204. Accordingly, the source/drain trenches 204 extends to a depth along the top surface of the substrate 105. In some other embodiments (not shown), the process 500 removes only some, but not all, of the fin structure 108 adjacent the gate structures 250, such that the substrate 105 is not exposed in the source/drain trenches 204. Accordingly, the source/drain trenches 204 extends to a depth above the top surface of the substrate 105. The process 500 may include multiple lithography and etching steps, and may use any suitable methods, such as dry etching and/or wet etching.

The formation of the source/drain trenches 204 exposes sidewalls of the stack of semiconductor layers 110 and 120. Referring to block 20 of FIG. 2A and FIGS. 7A and 7B, portions of the semiconductor layers 110 are removed through the exposed sidewall surfaces in the source/drain trenches 204 via a selective etching process, such as process 520. The process 520 recesses the semiconductor layers 110 in a lateral direction along the X-direction and thus can be referred to as lateral etching process 520 or lateral recessing process 520. The process 520 is designed to remove portions of the semiconductor layers 110 but only minimally affect (or not affect) the semiconductor layers 120. For example, two side portions (or interchangeably referred to as end portions) of the semiconductor layers 110 may be removed to form openings 205 while the side portions of the semiconductor layers 120 directly above and below the openings 205 are substantially preserved. In some embodiments, those side portions of the semiconductor layers 120 may have their thicknesses (along the Z-direction) slightly reduced (such as by about 1% to about 10%) during the process 520. Moreover, sidewall surfaces of the semiconductor layer 120 may be slightly altered during the process 520. The selective etching process may be any suitable processes. In the depicted embodiment, the semiconductor layers 120 include Si and the semiconductor layers 110 include SiGe. The process 520 may be a wet etching process, such as a Standard Clean 1 (SC-1) solution. The SC-1 solution includes ammonia hydroxide ($NH_4OH$), hydrogen peroxide ($H_2O_2$), and water ($H_2O$). The SiGe-based semiconductor layers 110 may be etched away in the SC-1 solution at a substantially faster rate than the Si-based semiconductor layers 120. The etching duration is adjusted such that the size of the removed portions of SiGe layers is controlled. As a result, desired portions of the semiconductor layers 110 are removed while the semiconductor layers 120 are only minimally affected (or not affected). The optimal condition may be reached by additionally adjusting the etching temperature, dopant concentration, as well as other experimental parameters, taking into account factors to be discussed below.

Figures 7A, 7B:
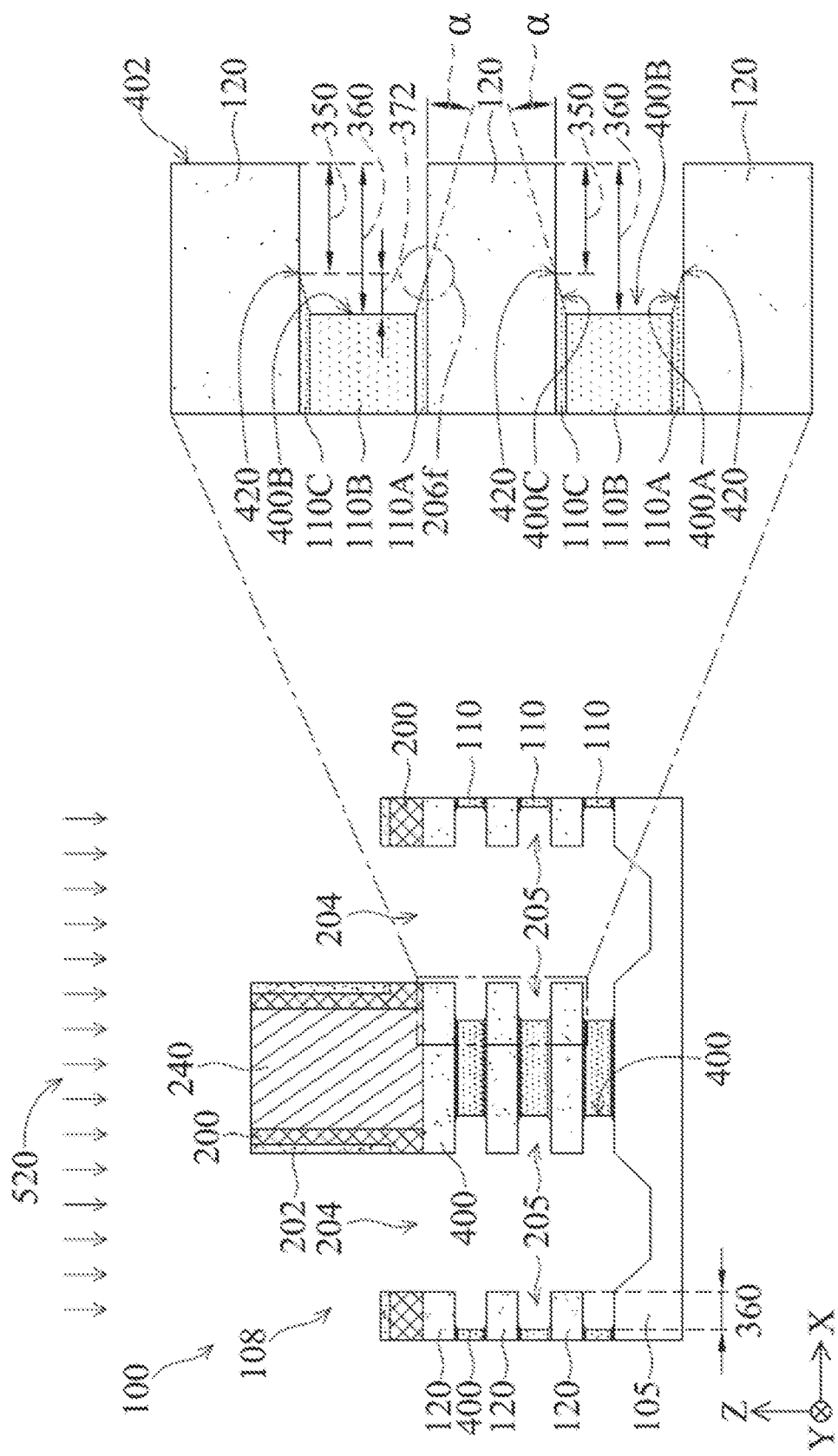
Figure 7C:
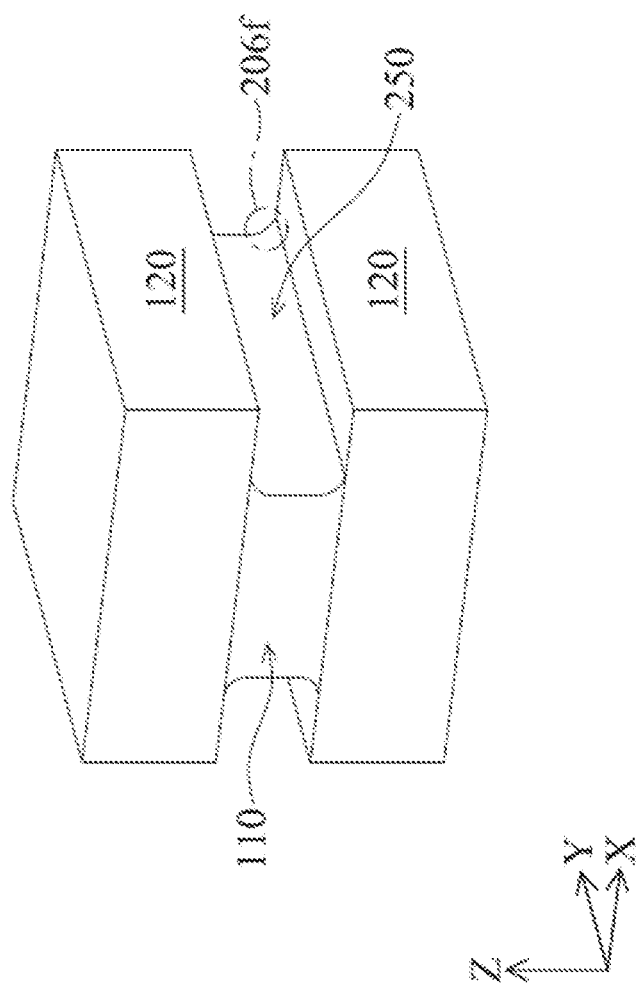
FIG. 7C is an expanded 3D perspective view of a portion of a nano-sheet-based device of the present disclosure constructed at a fabrication stage according to some embodiments of the present disclosure.
Figures 8A, 8B:
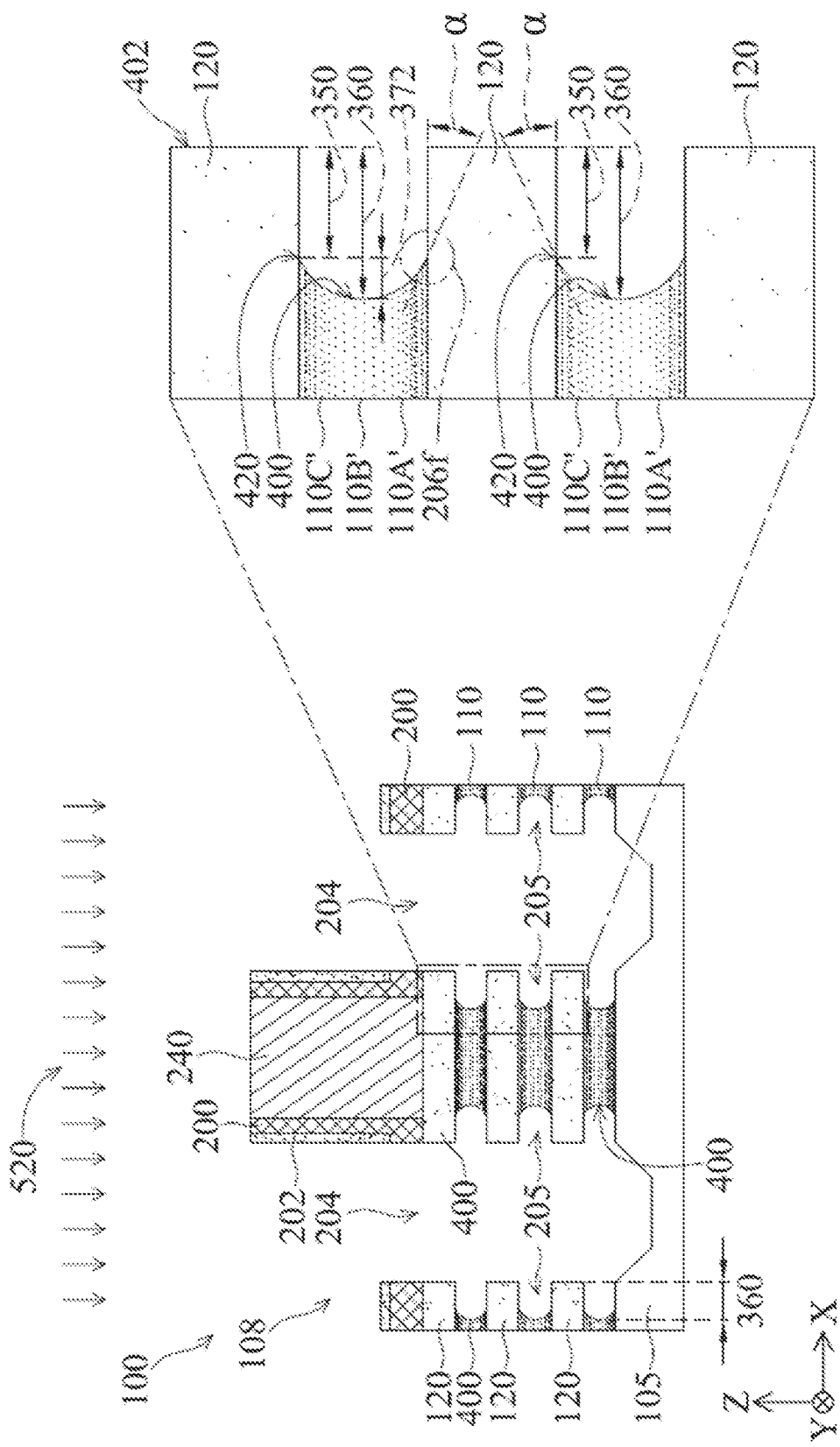
Figures 9A, 9B:
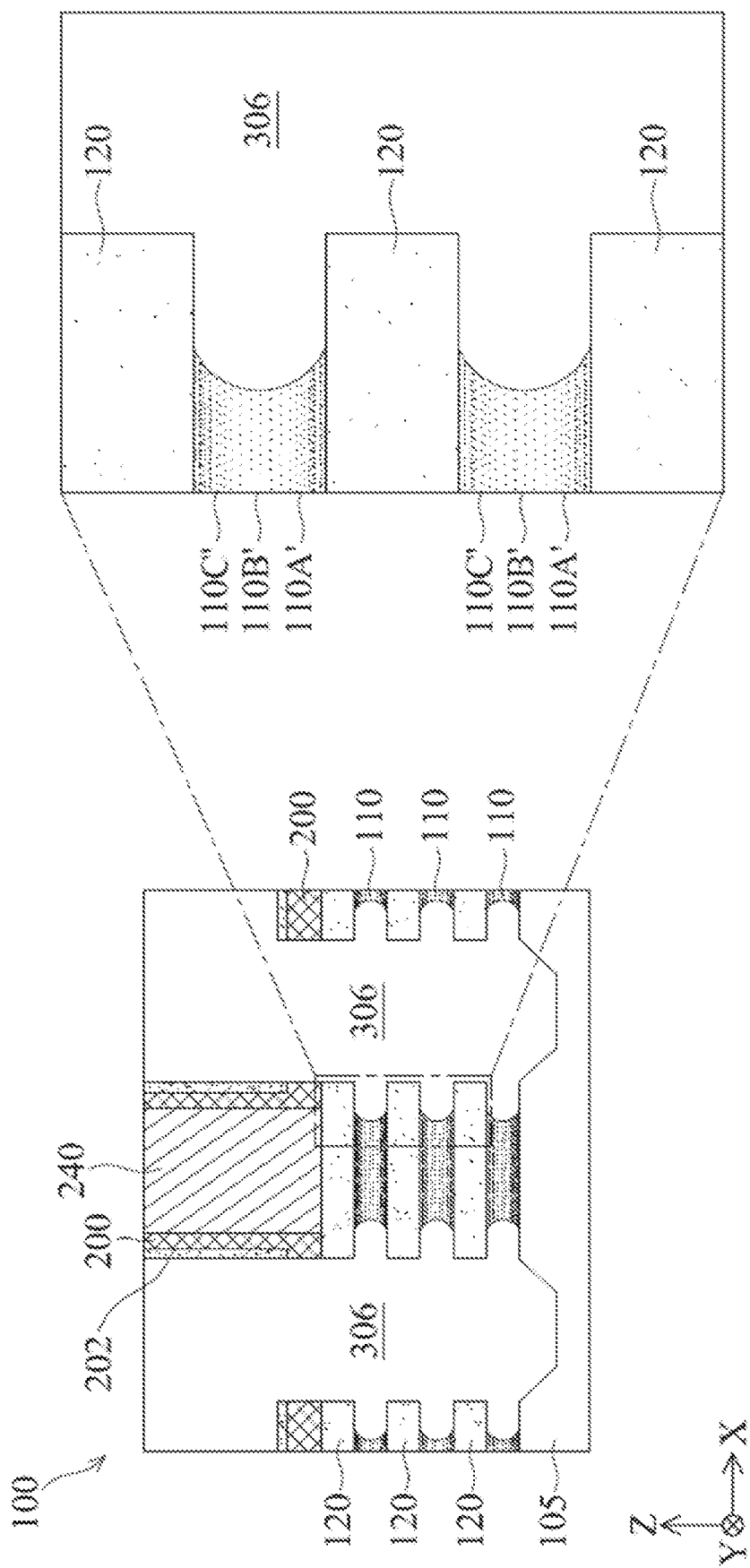

FIGS. 7A and 7B illustrate situations where the semiconductor layers 110 each include three sublayers 110A, 110B, and 110C (that is, the embodiment illustrated in FIGS. 3A and 3B). The sublayers 110A are etched by a different amount than the sublayer 110B; and the sublayers 110B are etched by a different amount than the sublayer 110C. Accordingly, the etched semiconductor layer 110 and the openings 205 each have a sidewall surface 400 (or interface 400) that has a segmented or semi-curved profile. The sidewall surface 400 later becomes a sidewall surface 206w of the subsequently formed inner spacers 206 (see FIGS. 10A, 10B). In the depicted embodiment, after the processing 520, the sublayer 110A is recessed by at least a distance of distance 350; the sublayer 110B is recessed by a distance of distance 360; and the sublayer 110C is recessed by at least a distance of distance 350. As illustrated in FIG. 7B, sidewall surfaces of the sublayer 110A of the semiconductor layer 110 interfaces with the semiconductor layer 120 at interface line 420 (extending along the Y-direction). The distance along the X-direction between the interface line 420 and the YZ plane (along which the sidewall surface 402 of the semiconductor layer 120 extends) is the distance 350; and the maximum distance along the X-direction between the sublayer 110B and the YZ plane (along which the sidewall surface 402 extends) is the distance 360. As illustrated, the distance 350 is less than the distance 360.

Meanwhile, as described above, the semiconductor layers 120 are largely preserved during the process 520 due to their superior etching resistance to the etching chemical. In the depicted embodiments, the profiles of the sidewall surfaces 402 are substantially unchanged. However, in some embodiments, the etching chemical may nevertheless affect the profile of the sidewall surfaces 402 of the semiconductor layers 120. For example, corners of the semiconductor layers 120 may be slightly etched during the process 520. Accordingly, after the process 520, the semiconductor layers 120 may have rounded (or curved) surfaces.

In some embodiments, different portions of the sublayer 110A are etched by a different amount. For example, the bottom portion of the sublayer 110A (such as the portion at the interface with the semiconductor layer 120 or the substrate 105) is etched by the distance 350. However, the top portion of the sublayer 110A (such as the portion at the interface with the sublayer 110B) is etched by the distance 360. The portions between the top portions and the bottom portions are etched by an amount between the distance 350 and distance 360. The etched amount changes gradually and continuously between adjacent portions throughout the thickness dimension of the sublayer 110A (along the Z-direction). Without being limited by theory, this may be because the semiconductor layer 120 functions as a physical barrier that partially blocks diffusions of the etching chemical from approaching a particular region of the sublayer 110A. The closer the particular region of the sublayer 110A is to the physical barrier, the less diffusion of etching chemical occurs. Because the probability of being etched (hence the etch rate) scales with the diffusion of the etching chemical, the regions of the sublayer 110A that is closer to the semiconductor layer 120 is etched less than regions that are further away. This produces a sidewall surface 400A that is canted from the vertical direction (such as the Z-direction). This etch rate difference between different regions of the sublayer 110A is not related to the intrinsic properties of the material or material compositions. For example, the materials and material compositions of these regions may be uniform and the same as each other. Rather, this etch rate difference is an effect of the environmental effect around the target for the etching process. In other words, the different magnitude of environmental effect experienced by different portions of the sublayer 110A causes the otherwise same etch rates to decrease to a different extent, which results in the canted sidewall profile of the sidewall surface 400A. In the depicted embodiments, the sidewall surface 400A is substantially straight. However, in some embodiments, the sidewall surface 400A may also be curved, depending on the adopted etching conditions.

In some embodiments, a tangential direction of the sidewall surfaces 400A of the sublayer 110A spans an angle $\alpha$ that is less than 90° from the top surface of the adjacent semiconductor layer 120. For example, the angle $\alpha$ may be about 30° to about 90°. The angle $\alpha$ may be at least partially determined by the materials of the sublayer 110A and the etching chemical. Furthermore, the angle $\alpha$ may be tuned by adjusting the etching parameters, such as etching temperature, etching gas flow rate, other suitable etching parameters, or combinations thereof. If the angle $\alpha$ is too small, such as less than 30°, the curvature of the sidewall surfaces 400 of the etched semiconductor layer 110 (and that of the sidewall surfaces of the subsequently formed inner spacer) may be too large such that damage-prone areas may be formed. Conversely, the sidewall surfaces of the sublayer 110A and that of the semiconductor layer 120 may present diffusional restrictions (or serving as physical barriers) to any materials deposited into the angled area between them. If the angle α is too large, such as greater than 90°, such diffusional restrictions may be too severe for the tip area between the sidewalls to be properly filled. Accordingly, voids may form therein which has been shown to cause increased resistances. The angle α in conjunction with the thickness of the sublayer 110A define the footing region 206f. In the depicted embodiment, the footing region 206f has a lateral width 372 at the interface between the sublayer 110A and the semiconductor layer 120. The lateral width 372 equals to the difference between the distance 350 and the distance 360. In some embodiments, a ratio of the lateral width 372 to the thickness 320 of the sublayer 110A (see FIG. 3B) is about 0.5 nm to about 2 nm. This ratio is correlated with the magnitude of the angle α.

Similarly, the sublayer 110C has a sidewall surface 400C. The sidewall surfaces 400C may also be canted for reasons similar to that for the sublayer 110A. For example, the sidewall surfaces 400C form another footing region 206f at the interface with another semiconductor layer 120. In some embodiments, the sidewall surfaces 400C may span the angle α from the top surface of the adjacent semiconductor layer 120. However, the sidewall surfaces 400C may alternatively span a different angle from the bottom (and top) surface of the adjacent semiconductor layer 120.

In the depicted embodiments, the sublayers 110A, 110B, and 110C are configured such that all portions of the sublayer 110B are sufficiently far away from any physical barriers (such as the adjacent semiconductor layers 120). Accordingly, the physical barrier effect described above due to the presence of the semiconductor layers 120 causes only minimal variations in the etched amount for different portions of the sublayer 110B. The sublayer 110B thus has a sidewall surface 400B that is substantially vertical or close to vertical. However, in other embodiments, the sublayers 110B may be configured such that the top and bottom portions of the sublayer 110B are still affected by the physical barrier effect, albeit to an extent less than portions of the sublayers 110A and 110C. Accordingly, the sublayer 110B may still have a curved sidewall surface 400B. For example, the top and bottom portions of the sublayer 110B are etched by a smaller amount than the middle portion of the sublayer 110B. In other words, the sidewall surface of the sublayer 110B has a concaved profile with the middle portion of the profile protruding from the openings 205 into the remaining portions of the sublayer 110B. In such embodiments, the distance 360 refers to the maximum distance along the X-direction between the sidewall surface of the sublayer 110B and the YZ plane along which the sidewall surfaces 402 extends. This distance 360 corresponds to the width of the openings 205 at the mid-height level. Other portions (such as top and bottom portions) of the openings 205 have widths less than the distance 360 and greater than the distance 350.

The sidewall surfaces 400A, 400B, and 400C collectively form the sidewall surface 400 that later becomes the sidewall surfaces 206w of the subsequently formed inner spacer 206. As described above, it may be beneficial to form sidewall surfaces 206w having smaller curvatures. In some embodiments, this is achieved by configuring the sublayers 110A and 110C with higher Ge atomic percentages. For example, the subsequent etching process may be configured to provide etch rates that depends on the Ge atomic percentages. Therefore, sublayers 110A and 110C having greater Ge atomic percentages are etched at a rate faster than sublayer 110B having a smaller Ge atomic percentage. Accordingly, the intrinsic etch rate for the sublayers 110A and 110C are greater than the intrinsic etch rate for the sublayer 110B. Meanwhile, the sublayers 110A and 110C are closer to the physical barrier (i.e. semiconductor layers 120 and substrate 105). Accordingly, environmental factors (such as the physical location) affect the sublayers 110A and 110C more than they affect the sublayer 110B. The actual etch rate of a sublayer is a combination of the intrinsic etch rate and the environmental factors. In the depicted embodiment, the environmental effect dominates over the effect of the increased Ge atomic percentages, such that sublayers 110A and 110C are etched to a smaller extent than the sublayer 110B. Nevertheless, at least a portion of the environmental effect is offset by the effect of the increased Ge atomic percentage. Therefore, as compared to a semiconductor layer 110 that has uniform Ge atomic percentage (e.g. an atomic percentage that corresponds to the average Ge atomic percentages of sublayers 110A, 110B, and 110C), the curvature of the sidewall surfaces 206w is reduced and the profile of 206w is more rectangular (or more square).

In the depicted embodiment, a ratio of the distance 350 to the distance 360 is about 0.65 to about 1. This ratio provides a measure for the curvature of the sidewall surfaces 400 of the etched semiconductor layers 110. This curvature in turn determines the curvature of the sidewall surfaces 206w of the subsequently formed inner spacers 206. As described above and discussed in more detail later, the inner spacers 206 with more square-like profiles provide for better protection of source/drain features during channel release processes and better isolation between source/drain features and metal gates for TDDB (Time Dependent Dielectric Breakdown) performance concerns. If the ratio is too small, such as less than 0.65, the curvature may be too large (or, the sidewall surface may be too rounded) such that the subsequently formed device may not provide sufficient isolation between source/drain features and metal gates. Conversely, if the ratio is too large, such as greater than 1, voids may be formed in the tip areas between the sidewall surface of the etched semiconductor layer 110 and the top or bottom surface of the semiconductor layers 120 and such voids may not be easily filled with gate dielectric and gate metals and may cause non-uniformity among transistors. The ratio of the distance 350 to the distance 360 may be determined collectively by the thicknesses of the sublayers, the difference in the material composition between the sublayer 110B and that of the sublayer 110A or the sublayer 110C, in conjunction with the etching chemicals and conditions. Accordingly, referring to FIG. 7C, by engineering the thicknesses and the material compositions of the sublayers and choosing appropriate etching chemicals and conditions, proper profile of the sidewall surfaces 206w and the proper profile of the footing region 206f may be achieved.

As described above, alternative to the three-sublayer structure illustrated in FIGS. 7A and 7B, a single layer semiconductor layer 110 that has a gradient structure (such as those illustrated in FIGS. 4A and 4B) may be implemented to achieve the inner spacers 206 that have sidewalls with the reduced curvature. In such embodiments, the processing 520 results in a device 100 that has a structure illustrated in FIGS. 8A and 8B. The structures of FIGS. 8A and 8B generally resemble those already described above with respect to FIGS. 7A and 7B. The structures differ here in that the material compositions vary gradually and continuously across the thickness dimension of the semiconductor layer 110. Accordingly, the amount of etching also varies gradually and continuously across the thickness dimension of the semiconductor layer 110. As a result, the sidewall surfaces of the region 110A', sidewall surfaces of the region 110B', and the sidewall surfaces of the region 110C' transitions gradually and continuously from one region to the other without sharp interfaces. In other words, no clearly segmented sidewall surface portions like 400A, 400B, and 400C of FIGS. 7A and 7B are produced. Additionally, the openings 205 have substantially smooth and curved sidewall surfaces. As described above, the profile of the sidewall surfaces 400 of the etched semiconductor layer 110 determines the profile of the sidewall surfaces 206w of the subsequently formed inner spacers 206 (see FIGS. 10A, 10B). In some embodiments, sidewall surfaces of the region 110A' of the semiconductor layer 110 interfaces with the semiconductor layer 120 at interface line 420 (extending along the Y-direction). The distance along the X-direction between the interface line 420 and the YZ plane along which the sidewall surface 402 of the semiconductor layer 120 extends is the distance 350; and the maximum distance along the X-direction between the region 110B' and the sidewall surface 402 is the distance 360. Similar to that described above with respect to FIGS. 7A and 7B, a ratio of the distance 350 to distance 360 is about 0.65 to about 1. Moreover, the sidewall surface of the region 110A' may have a tangential direction at the interface line 420 that spans an angle α from the top (or bottom) surface of the semiconductor layer 120. Also similar to that described above with respect to FIGS. 7A and 7B, the angle α may be about 30° to about 90°. Moreover, footing regions 206f are also formed at the interface between the regions 110A' and the semiconductor layer 120 (or the substrate 105) or between the regions 110C' and the semiconductor layer 120 (or the substrate 105). The footing regions 206f may be similar to the foot regions 206f described above with respect to FIGS. 7A and 7B. However, the profiles of the footing regions 206f may be different. For example, rather than having a substantially straight sidewall surface, the footing regions 206f here may have a curved sidewall surface, or vice versa. Alternatively, footing regions 206f described in FIGS. 7A and 7B and in FIGS. 8A and 8B may both be curved although with different curvatures. As described above, configurations that include more than three sublayers may similarly adopted by reference to the methods described herein.

In the depicted embodiments, the semiconductor layers 120 include Si and the semiconductor layers 110 include SiGe. In another embodiment, the semiconductor layers 120 include SiGe and the semiconductor layers 110 includes Si. In such an embodiment, in order to achieve the designed device structure, the selective etching may be designed such that SiGe is etched at an etch rate less than Si. For example, a cryogenic deep reactive ion etching (DRIE) process may be used to selectively etch away the Si-based semiconductor layer 110. For example, the DRIE process may implement a sulfur hexafluoride-oxygen ($SF_6$—$O_2$) plasma. The optimal condition may be reached by adjusting the etching temperature, the power of the Inductively Coupled Plasma (ICP) power source and/or Radio Frequency (RF) power source, the ratio between the $SF_6$ concentration and the $O_2$ concentration, the dopant (such as boron) concentrations, as well as other experimental parameters. For example, the etch rate of a Si-based semiconductor layer 110 using a $SF_6$—$O_2$ plasma (with approximately 6% $O_2$) may exceed about 8 µm/min at a temperature of about −80° C.; while the SiGe-based semiconductor layers 120 are not substantially affected during the process.

Processing continues to form various features of the device 100. Subsequent illustrations of the method proceed from the FIGS. 8A and 8B, using the single layer semiconductor layer 110 with gradient structure as an example. However, the same processing method applies to other alternative methods as well. Referring to block 22 of FIG. 2B and FIGS. 9A and 9B, a dielectric material 306 is deposited into both the source/drain trenches 204 and the openings 205 (compare FIG. 8A). The dielectric material 306 may be selected from $SiO_2$, SiON, SiOC, SiOCN, or combinations thereof. In some embodiments, the proper selection of the dielectric material may be based on its dielectric constant (as described later). The deposition of the dielectric material 306 may be any suitable methods, such as CVD, PVD, PECVD, MOCVD, ALD, PEALD, or combinations thereof. In the depicted embodiment, the dielectric material 306 may have a top surface that extends along a top surface of the dummy gate stack 240. In other embodiments, the dielectric material 306 may have a top surface that extends above the top surface of the dummy gate structure 240, and a CMP process may be performed to planarize the top surfaces of the device, and to expose the top surfaces of the dummy gate stack 240.

Figures 10A, 10B:
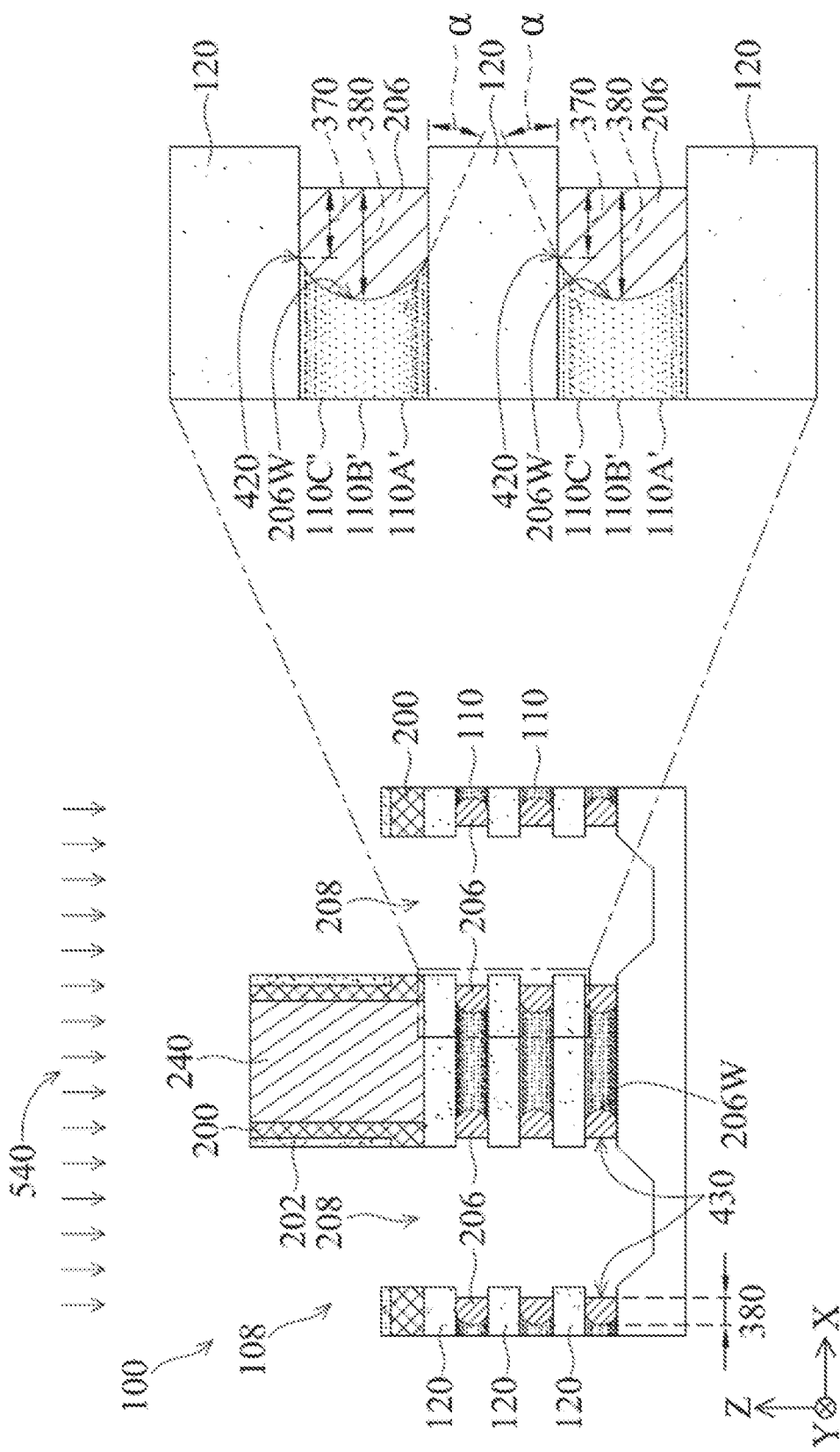

Referring to FIGS. 10A and 10B, the dielectric material 306 is partially etched back by process 540 to form new source/drain trenches 208. The partial etching-back completely removes the dielectric materials 306 within the original source/drain trenches 204 (compare FIG. 6), and removes a portion, but not all, of the dielectric materials 306 within the original openings 205 (compare FIG. 8A). The dielectric materials 306 remaining in the openings 205 become the inner spacers 206. Accordingly, the inner spacers 206 are formed between vertically adjacent semiconductor layers 120 and on sidewall surfaces of the etched semiconductor layers 110. In an embodiment, the etching-back is a self-aligned anisotropic dry-etching process, such that the gate spacer layers 200 or 202 are used as the masking element. Alternatively, a different masking element (e.g. a photoresist) may be used.

As described above, the inner spacers 206 interfaces with the etched semiconductor layers 110 at the interface 400. Accordingly, the interface 400 becomes a sidewall surface 206w of the inner spacers 206. Additionally, the inner spacers 206 have a new sidewall surface 430 exposed in the source/drain trenches 208. The distance between the sidewall surfaces 400 and 430 defines the lateral width of the inner spacers 206. The new sidewall surface 430 may be of a same or different profile as that of the sidewall surface 400. When the sidewall surfaces 400 and 430 have different profiles, the inner spacers 206 may have varying lateral widths at different heights of the inner spacers 206 along the Z-direction. For example, a top portion and a bottom portion of the inner spacers 206 may each have a lateral width 370 at their respective interfaces with the semiconductor layers 120 (or the substrate 105); while a middle portion of the inner spacers 206 may have a lateral width 380. In some embodiments, the lateral width 380 may be greater than the lateral width 370. In an embodiment, the lateral width 370 may be about 5 nm to about 7 nm, and the lateral width 380 of about 5.5 nm to about 11 nm. Moreover, a ratio of the lateral widths 370 to 380 may be about 0.65 to about 1. Similar to the ratio of the distance 350 to the distance 360 described above, this ratio provides another measure for the curvature of the sidewall surfaces 206w. The greater the ratio is (such as approaching 1), the smaller the curvatures are. Sidewall surfaces 206w having a smaller curvature (or square-like profile) provide for better protection of source/ drain features during channel release processes and better isolation between source/drain features and metal gates for TDDB performance concerns. If the ratio is too small, such as less than 0.65, the curvature may be too large (or, the sidewall surface may be too rounded) such that the subsequently formed device may not provide sufficient isolation between source/drain features and metal gates. Conversely, if the ratio is too large, such as greater than 1, voids may be formed in the tip areas between the sidewall surface of the etched semiconductor layer 110 and the top or bottom surface of the semiconductor layers 120 and such voids may not be easily filled with gate dielectric and gate metals and may cause non-uniformity among transistors. The ratio of the lateral widths 370 to 380 is determined collectively by the distance 350, the distance 360, the spacer materials of the inner spacers 206 and the conditions for the etch-back process 540. Accordingly, the ratio of the lateral widths 370 to 380 may be adjusted through the adjustment of the distances 350 or distance 360.

Figure 11:
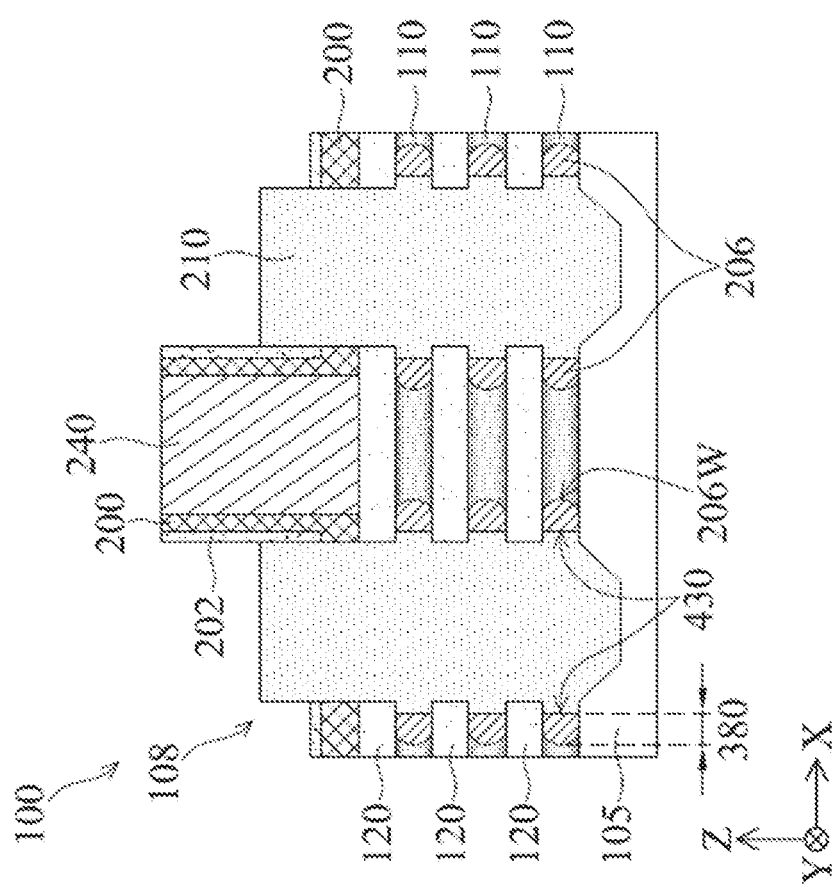

Referring to block 24 of FIG. 2B and FIG. 11, epitaxial source/drain features 210 are formed in the source/drain trenches 208. Accordingly, the epitaxial source/drain features 210 interface with the inner spacers 206 at the sidewall surfaces 430. Multiple processes, including etching and growth processes, may be employed to grow the epitaxial source/drain features 210. In the depicted embodiment, the epitaxial source/drain features 210 have top surfaces that extend higher than the top surface of the topmost semiconductor layer 120. However, in other embodiments, the epitaxial source/drain features 210 may alternatively have top surfaces that are about even with the top surface of the topmost semiconductor layer 120. In some embodiments, the epitaxial source/drain features 210 may merge together, for example, along the Y-direction (see e.g., FIG. 1A), to provide a larger lateral width than an individual epitaxial source/drain feature.

In some embodiments, the epitaxial source/drain features 210 are configured to be part of the PMOS transistor. Accordingly, the epitaxial source/drain features 210 may include any suitable p-type semiconductor materials, such as Si, SiGe, Ge, SiGeC, or combinations thereof. In some embodiments, the epitaxial source/drain features 210 are configured to be part of the NMOS transistor. Accordingly, the epitaxial source/drain features 210 may include any suitable n-type semiconductor materials, such as Si. The epitaxial source/drain features 210 may further be doped in-situ or ex-situ. For example, the epitaxially grown SiGe source/drain features of a PMOS may be doped with boron (B) to form Si:Ge:B source/drain features; and the epitaxially grown Si source/drain features of an NMOS may be doped with carbon to form silicon:carbon (Si:C) source/drain features, doped with phosphorous to form silicon:phosphor (Si:P) source/drain features, or both carbon and phosphorous to form silicon carbon phosphor (Si:C:P) source/drain features. One or more annealing processes may be performed to activate the dopants in the epitaxial source/drain features 210. The annealing processes may comprise rapid thermal annealing (RTA) and/or laser annealing processes. As illustrated in FIG. 11, each pair of epitaxial source/drain features 210 are connected by multiple semiconductor layers 120, which serve as the carrier conduit between the epitaxial source/drain features 210 during the operation.

Figure 12:
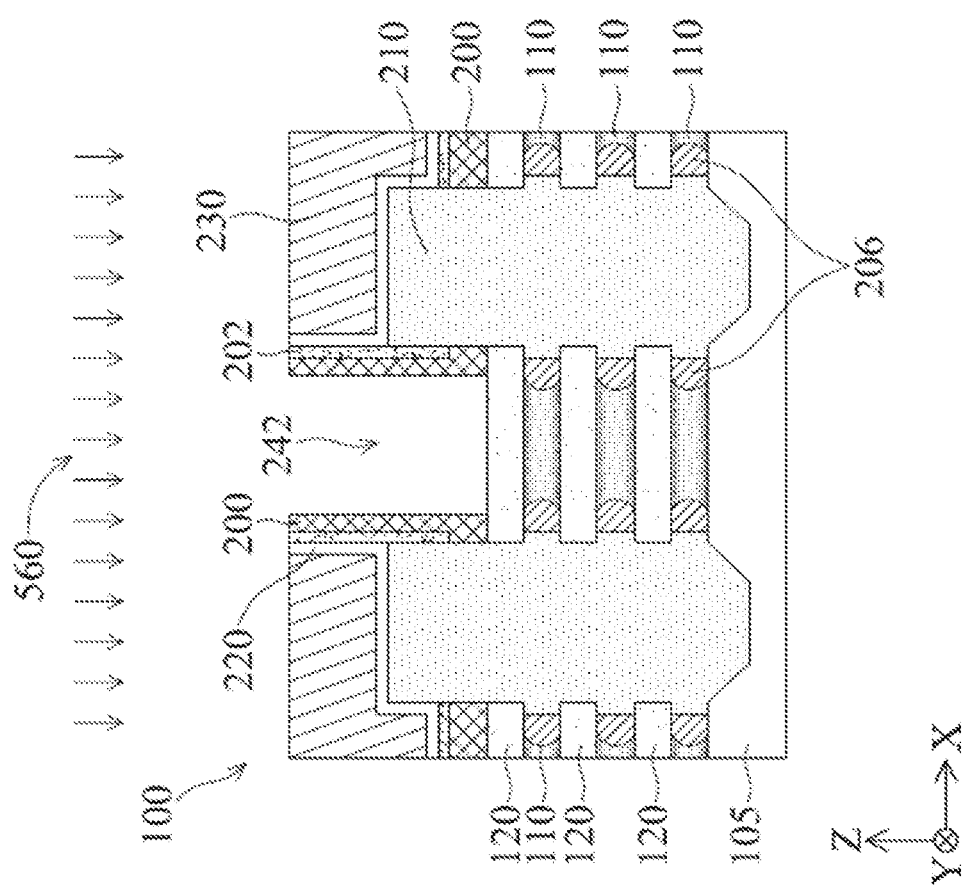

Referring to block 26 of FIG. 2B and to FIG. 12, an ILD layer 230 is formed over the epitaxial source/drain features 210, as well as over the isolation features 150 (see FIG. 1A). The ILD layer 230 may also be formed in between the adjacent gate structures 250 along the X-direction, and in between the adjacent epitaxial source/drain features 210 along the Y-direction. The ILD layer 230 may include a dielectric material, such as a high-k material, a low-k material, or an extreme low-k material. For example, the ILD layer 230 may include $SiO_2$, SiOC, SiON, or combinations thereof. The ILD layer 230 may include a single layer or multiple layers, and may be formed by a suitable technique, such as CVD, ALD, and/or spin-on techniques. After forming the ILD layer 230, a CMP process may be performed to remove excessive ILD layer 230 and planarized the top surface of the ILD layer 230. Among other functions, the ILD layer 230 provides electrical isolation between the various components of the device 100. In some embodiments, a contact etch stop layers 220 is formed, prior to the forming of the ILD layer 230, over the epitaxial source/drain features 210, as well as gate spacer layers 200 and/or 202. The etch-stop layer protects the underlying features from subsequent etching processes.

Referring to block 28 of FIG. 2B and to FIG. 12, the dummy gate stacks 240 are selectively removed in process 560 from the gate structures 250. The removal of the dummy gate stacks 240 creates gate trenches 242, which expose the respective top surfaces and the side surfaces of the semiconductor stacks (along the Y direction). The process 560 may be selected from any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate stacks 240. Then, the dummy gate stacks 240 are selectively etched through the masking element. In some other embodiments, the gate spacer layers 200 and/or 202 may be used as the masking element or a part thereof. In some embodiments, the forming of the gate trenches in the NMOS region is at a different time than the forming of the gate trenches in the PMOS region.

Figure 13:
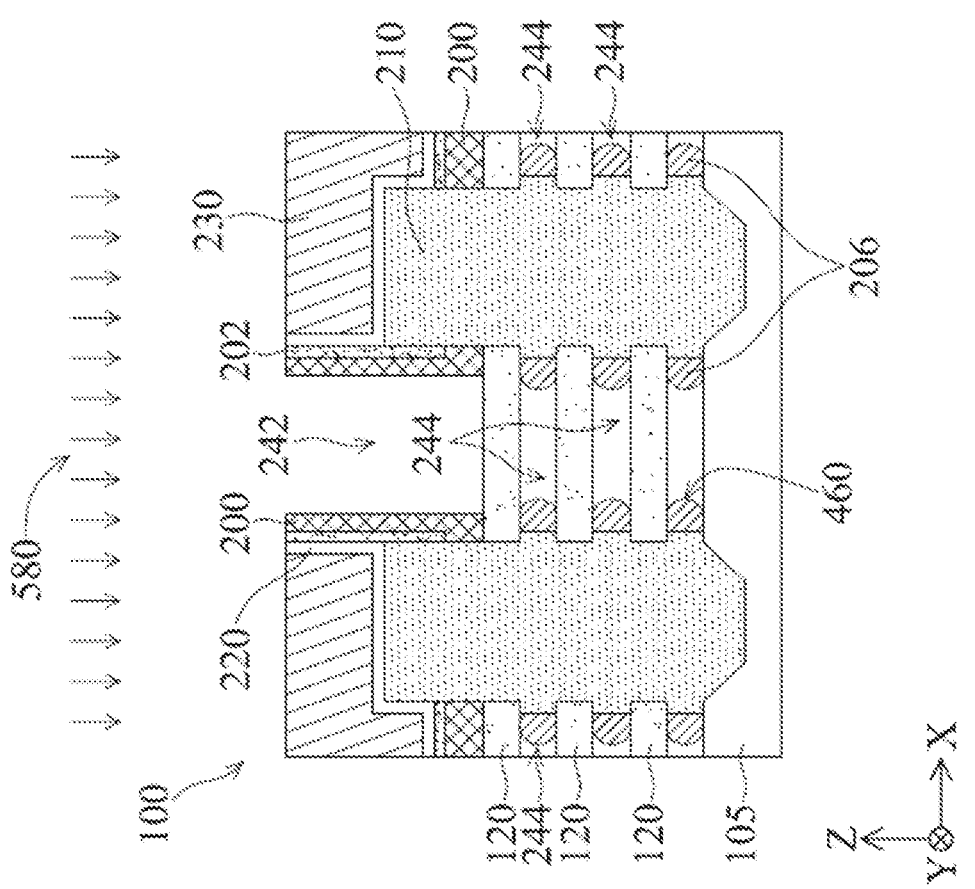

Referring to block 30 of FIG. 2B and to FIG. 13, the remaining portions of the semiconductor layers 110 are selectively removed through the exposed side surfaces of the semiconductor layers 120, for example, in process 580. While different regions or sublayers of the semiconductor layers 110 may have different etching selectivity, the processes 520 may be configured to remove the entirety of the semiconductor layers 110. Moreover, similar to processes 520, the semiconductor layers 120 may be slightly affected during the processes 580. For example, the thickness of the semiconductor layers 120 may be reduced by about 1% to about 10%. The removal of the remaining portions of the semiconductor layers 110 form suspended semiconductor layers 120, as well as openings 244 in between the vertically adjacent layers. Accordingly, the center portions of the semiconductor layers 120 each have exposed top and bottom surfaces. In other words, the center portions of each of the semiconductor layers 120 are now exposed circumferentially around the X-direction. In the depicted embodiments, the surfaces of the openings 244 are curved.

The processes 580 may be any suitable etching processes. In addition to exposing top and bottom surfaces of the center portions of the semiconductor layers 120, these processes also expose the sidewall surfaces of the inner spacers 206. The exposed sidewall surfaces may or may not have been modified by the processes 580. For example, the process 580 exposes surface 460 of the inner spacer 206. The surface 460 may be the same as, or different from, the sidewall surface 400, depending on the choices of the etching methods and/or the materials of the inner spacers 206.

In some embodiments (for example in forming of PMOS transistors), the epitaxial source/drain features 210 includes SiGe. Moreover, the semiconductor layers 110 also includes SiGe. Accordingly, there may be minimal (to none) etch rate differences during the etching process of the process 580. The inner spacers 206 separate the epitaxial source/drain features 210 from the area subject to the etching thereby protecting the epitaxial source/drain features 210. In some approaches not implementing the methods provided herein, the inner spacers 206 may have greater curvatures such that top and bottom portions of the inner spacers 206 are significantly thinner along the X-direction than the middle portions. Therefore, the inner spacers 206 at those top and bottom portions may be more likely breached by the etching chemical, thereby causing damages to the epitaxial source/drain features 210. By contrast, the inner spacers 206 has a sidewall with reduced curvatures. Accordingly, there is minimal variation in the strength of protection provided by the inner spacers 206 across the height dimension of the inner spacers 206. Accordingly, the design of overall dimension of the inner spacer 206 according to the present disclosure provides good protection of the source/drain features 210.

Referring to block 32 of FIG. 2B and FIGS. 14A and 14B, a metal gate stack 240' is formed in the gate trenches 242 and openings 244. For example, a gate dielectric layer 246 is formed over and between the semiconductor layers 120, and a conductive metal layer 248 is formed over and between the portions of the gate dielectric layers 246. In some embodiments, the gate dielectric layer 246 includes multiple layers. For example, the gate dielectric layer 246 may include a high-k dielectric layer. The high-k gate dielectric layer may be formed conformally such that it at least partially fills the gate trenches 242. In some embodiments, the high-k gate dielectric layer may be formed around the exposed surfaces of each of the semiconductor layers 120, such that it wraps around each of the semiconductor layers 120 in 360 degrees. The high-k gate dielectric layer may further be formed over the side surfaces of the inner spacers 206, and the gate spacer layers 200. The high-k gate dielectric layer may contain a dielectric material having a dielectric constant greater than a dielectric constant of $SiO_2$, which is approximately 3.9. For example, the high-k gate dielectric layer may include hafnium oxide ($HfO_2$), which has a dielectric constant in a range from about 18 to about 40. As various other examples, the high-k gate dielectric layer may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the high-k gate dielectric layers may be by any suitable processes, such as CVD, PVD, ALD, or combinations thereof.

In some embodiments, the gate dielectric layer 246 further includes an interfacial layer. The interfacial layer is formed between the semiconductor layers 120 and the high-k dielectric layer. Any suitable methods may be used to form the interfacial layer, such as ALD, CVD, or other deposition methods. Alternatively, the interfacial layer may also be formed by an oxidation process, such as thermal oxidation or chemical oxidation. In this instance, no interfacial layer is formed on the sidewalls of the inner spacers 206 or the gate spacer layers 200. In many embodiments, the interfacial layer improves the adhesion between the semiconductor substrate and the subsequently formed high-k dielectric layer. However, in some embodiments, the interfacial layer is omitted.

The conductive metal layer 248 is formed over the gate dielectric layer 246 and fills the remaining spaces of the gate trenches 242 and the openings 244. In some embodiments, the gate structures 250 in the PMOS region is formed at a different time as the gate structures 250 in the NMOS region. For example, a mask element may be formed to cover the NMOS region while the PMOS region is exposed for processing. After the gate structures 250 in the PMOS regions are formed, the mask element may be removed from the NMOS region. A second mask element may be formed to cover the PMOS region while the NMOS region is exposed for processing. Accordingly, gate structures 250 in the n-type transistor region may be formed. This process allows gate structures in the different transistor regions to include different materials. For example, the conductive metal layer 248 may include a work function metal layer. The work function metal layer for a PMOS transistor may include different materials from that of an NMOS transistor. In some embodiments, the work function metal layer for a PMOS transistor include a suitable p-type work function metal materials, such as titanium nitride (TiN), ruthenium (Ru), iridium (Ir), osmium (Os), rhodium (Rh), or combinations thereof; while the work function metal layer for an NMOS transistor include a suitable n-type work function metal materials, such as aluminum (Al), titanium aluminum (TiAl), or combinations thereof. The conductive metal layer 248 may further include a fill metal layer. The fill metal layer may include any suitable materials, such as aluminum (Al), tungsten (W), copper (Cu), cobalt (Co), nickel (Ni), platinum (Pt), ruthenium (Ru), or combinations thereof. In some embodiments, a CMP is performed to expose a top surface of the ILD layer 230. The gate dielectric layer 246 and the conductive metal layer 248 collectively form the metal gate stack 240'. The metal gate stack 240' engages multiple semiconductor layers 120 to form multiple gate channels. Furthermore, because the portions of the metal gate stack 240' between vertically adjacent semiconductor layers 120 interface with the inner spacers 206, those portions have the sidewall surfaces of the curved profile described above.

Figure 15B:
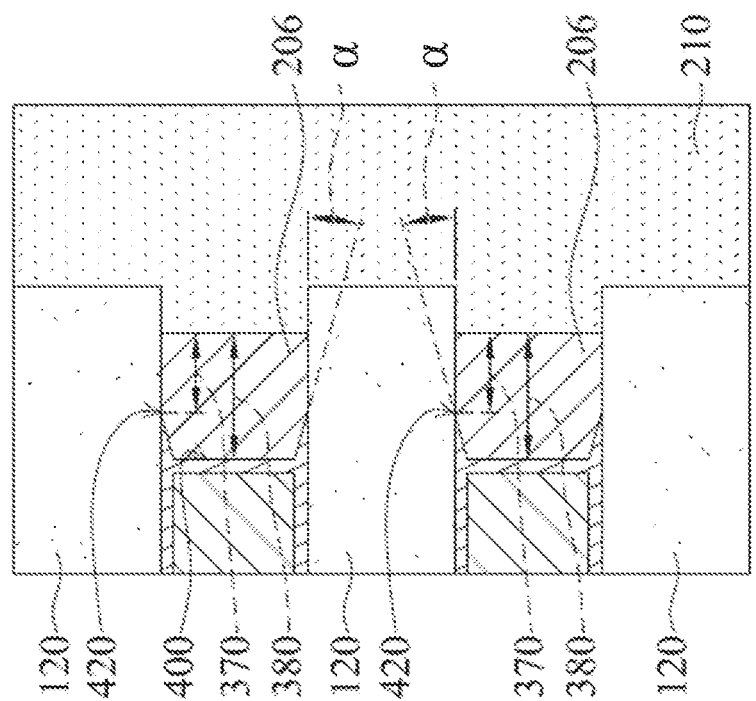
Figure 15A:
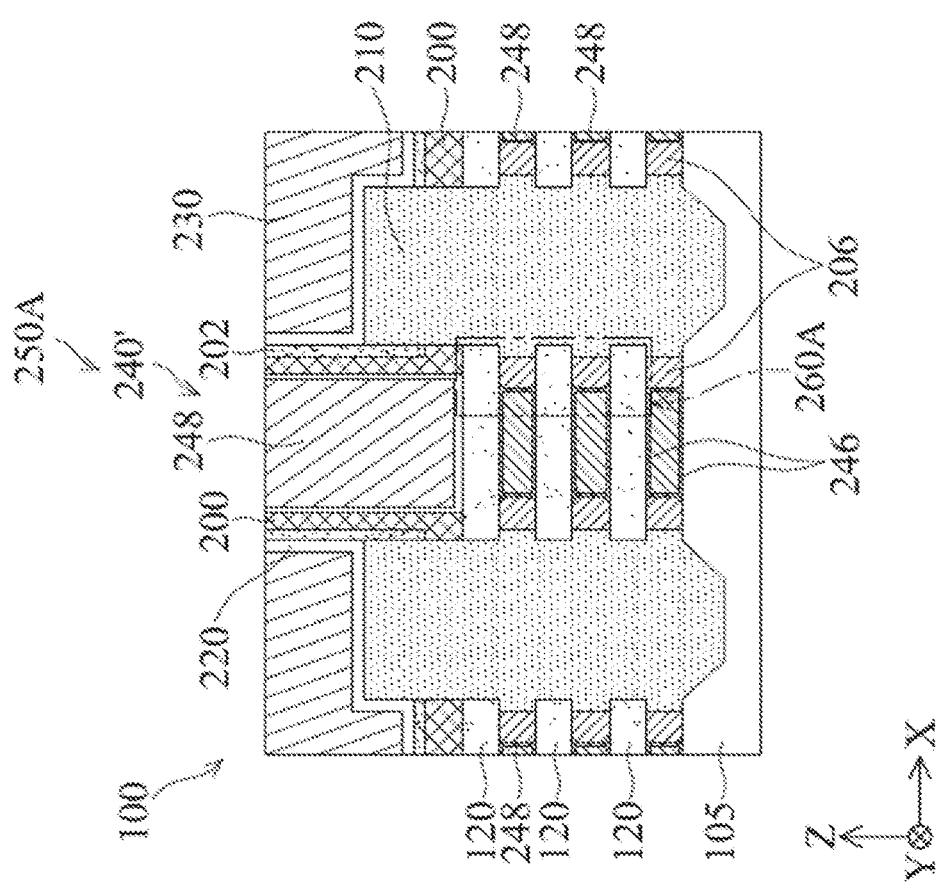

FIGS. 15A and 15B illustrate device 100 formed from the alternative structure depicted in FIGS. 3A and 3B, and through FIGS. 7A-7C. Features illustrated in FIGS. 15A and 15B resemble those of FIGS. 14A and 14B with the exception that the sidewall surfaces 400 (and sidewall surfaces 206w) include three straight segments rather than one continuous curve. Accordingly, the portion of the metal gate stack 240' that interfaces with the inner spacers 206 also have sidewall surfaces that include the three straight segments. However, as described above, the sidewall surfaces 400 (hence also sidewall surfaces of the portion of the gate structures 250) here may also be tuned, depending on design choices, into curved surfaces by tuning the material compositions, the etching chemicals, or the etching conditions.

The method 10 may continue to form additional features and complete the fabrications of the device 100. For example, silicide features, contact features, via features, or metal line features may be formed for the device 100. Processing steps may be added to or eliminated from the method 10 before or after any of the described steps. Additional steps can be provided before, during, and after the method 10, and some of the steps described may be replaced or eliminated, for additional embodiments of the method. It is further understood that additional features can be added in the device 100, and some of the features described may be replaced or eliminated, for additional embodiments of the device 100.

Though not intended to be limiting, embodiments of the present disclosure offer benefits for semiconductor processing and semiconductor devices. For example, the disclosed method provides a semiconductor layer 110 that includes sublayer structures or gradient structures where Ge atomic percentages vary throughout the height dimension. This enables the sidewall surfaces of the inner spacers to have reduced curvatures. As a result, the inner spacers provide similar protection to all area of the epitaxial source drain features, and no particular damage-prone areas are formed. As such, the present disclosure provides methods that improve the device performance, functionality, and/or reliability of nano-sheet-based transistors. Different embodiments may provide different benefits. Not all benefits are required for any embodiment.

In an exemplary aspect, the present disclosure is directed to a method. The method includes receiving a substrate and forming a stack over the substrate. The forming of the stack includes forming a first layer over the substrate; forming a second layer over the first layer; and forming a third layer over the second semiconductor layer. The first layer has a first semiconductor element; the second layer has a second semiconductor element different from the first semiconductor element; and the third layer has the first semiconductor element. Moreover, the second layer has the second semiconductor element at a first concentration in a first region of the second layer and at a second concentration in a second region of the second layer. The second concentration is different from the first concentration. The method includes etching a source/drain trench in a region of the stack to expose a side surface of the stack; and removing a first portion of the second layer from the exposed side surface to form a gap between the first and the third layers. The method further includes forming a spacer in the gap; and forming a source/drain feature in the source/drain trench and on a sidewall of the spacer.

In some embodiments, the forming of the second layer further includes forming the second layer having the second semiconductor element at a third concentration in a third region of the second layer. The first region and the third region sandwich the second region therebetween. Moreover, the third concentration is greater than the second concentration, and the first concentration is greater than the second concentration. In some embodiments, the etching of the source/drain trench includes etching using a chemical etchant. The first region of the second layer is etched at a first etch rate in the chemical etchant, and the second region of the second layer is etched at a second etch rate in the chemical etchant. A ratio of the first etch rate to the second etch rate is about 0.65 to about 1. In some embodiments, the first semiconductor element is silicon, the second semiconductor element is germanium, and the first concentration is greater than the second concentration. In some embodiments, a concentration of the second semiconductor element in the second layer changes from the first concentration in the first region to the second concentration in the second region. In some embodiments, the first concentration is about 20% to about 60% by atomic percentages, the second concentration is about 5% to about 50% by atomic percentages, and a ratio of the first concentration to the second concentration is about 1.1 to about 7. In some embodiments, the first concentration is about 30% to about 50% by atomic percentages, the second concentration is about 15% to about 35% by atomic percentages, and a ratio of the first concentration to the second concentration is about 1.2 to about 3. In some embodiments, the forming of the second layer includes forming with a first precursor and a second precursor, and further includes changing a flow rate ratio between the first precursor and the second precursor. In some embodiments, the forming of the second layer includes forming the first region of the second layer from a first precursor dosed at a first flow rate and a second precursor dosed at a second flow rate, and forming the second region of the second layer from the first precursor dosed at a third flow rate and the second precursor dosed at a fourth flow rate. A first ratio of the first flow rate to the second flow rate differs from a second ratio of the third flow rate to the fourth flow rate.

In an exemplary aspect, the present disclosure is directed to a method. The method includes receiving a substrate, forming a first semiconductor layer over the substrate, and forming a second semiconductor layer over the first semiconductor layer. The second semiconductor layer has a first region over the first semiconductor layer, a second region over the first region, and a third region over the second region. The first region and the third region each include a first material composition, and the second region includes a second material composition different from the first material composition. The method also includes forming a third semiconductor layer over the second semiconductor layer. Moreover, the method includes forming a source/drain trench extending through the first semiconductor layer, the second semiconductor layer, and the third semiconductor layer. Furthermore, the method includes laterally and selectively etching the second semiconductor layer to form an opening between an end portion of the first semiconductor layer and an end portion of the third semiconductor layer. The opening has a first interface with the etched second semiconductor layer. Additionally, the method includes forming a spacer in the opening, and forming a source/drain feature in the source/drain trench.

In some embodiments, the forming of the second semiconductor layer includes forming the first region of the second semiconductor layer from a first precursor and a second precursor. The first precursor and the second precursor are dosed at a first flow rate ratio. The forming of the second semiconductor layer also includes forming the second region of the second semiconductor layer from the first precursor and the second precursor. The first precursor and the second precursor are dosed at a second flow rate ratio. The forming of the second semiconductor layer further includes forming the third region of the second semiconductor layer from the first precursor and the second precursor. The first precursor and the second precursor are dosed at a third flow rate ratio. The first flow rate ratio is substantially the same as the third flow rate ratio, and the first flow rate ratio is different from the second flow rate ratio. In some embodiments, the forming of the second semiconductor layer includes adjusting flow rates of the first precursor and the second precursor such that a flow rate ratio changes against a layer thickness from the first flow rate ratio to the second flow rate ratio following a branch of a parabolic curve, and from the second flow rate ratio to the third flow rate ratio following an opposite branch of the parabolic curve. In some embodiments, the forming of the source/drain trench includes etching with an etchant. The first region of the second semiconductor layer has a first etch rate in the etchant. The second region of the second semiconductor layer has a second etch rate in the etchant. A ratio of the first etch rate to the second etch rate is about 0.65 to about 1. In some embodiments, the forming of the second semiconductor layer includes forming the first region having a semiconductor element at a first concentration of about 20% to about 60% by weight, and forming the second region having the semiconductor element at a second concentration of about 5% to about 50%. A ratio of the first concentration to the second concentration is about 1.1 to about 7. In some embodiments, the first material composition and the second material composition both includes silicon germanium, and the second semiconductor layer includes silicon.

In an exemplary aspect, the present disclosure is directed to an integrated circuit (IC) device. The IC device includes a semiconductor substrate having a top surface; a source feature and a drain feature over the semiconductor substrate; a semiconductor layer suspended over the top surface and connecting the source feature and the drain feature along a horizontal direction. The integrated circuit also includes a gate electrode wrapping around and engaging the semiconductor layer, as well as a spacer. The spacer is vertically between an end portion of the semiconductor layer and the top surface, and horizontally between the source feature and the gate electrode. Moreover, the spacer has a lateral dimension along the horizontal direction and a vertical dimension along a vertical direction perpendicular to the top surface. The lateral dimension varies in length across the vertical dimension and has a minimum length at an interface between the spacer and the semiconductor layer, and a maximum length at a half-height level of spacer. A ratio of the minimum length to the maximum length is about 0.65 to about 1.

In some embodiments, the spacer has a curved sidewall surface. A tangential direction of the curved sidewall surface at the interface spans an angle from the horizontal direction of about 30° to about 90°. In some embodiments, the suspended semiconductor layer is one of the plurality of suspended semiconductor layers, and the spacer is one of the plurality of spacers. Each of the spacers interface with a respective suspended semiconductor layer of the plurality of suspended semiconductor layers. The plurality of spacers each span a tangential angle from its respective suspended semiconductor layer. The tangential angle is about 30° to about 90°. In some embodiments, the IC device further includes a gate dielectric. The gate dielectric has a curved profile. A tangential direction of the curved profile at an interface between the gate dielectric and the suspended semiconductor layer spans an angle from the horizontal direction. The angle is about 30° to about 90°. A distance between the suspended semiconductor layer and the top surface is about 3 nm to about 15 nm, the minimum length is about 5 nm to about 7 nm, and the maximum length is 5.5 nm to about 11 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming over a substrate a stack that comprises a plurality of first layers interleaved by a plurality of second layers;
    patterning the stack to form a fin-shaped structure comprising a channel region and a source/drain region;
    forming a dummy gate stack over the channel region of the fin-shaped structure;
    etching the source/drain region of the fin-shaped structure to form a source/drain trench that exposes sidewalls of the plurality of first layer and the plurality of second layers;
    selectively and partially etching the sidewalls of the plurality of second layers to form inner spacer recesses;
    forming inner spacer features in the inner spacer recesses; and
    after the forming of the inner spacer features, forming a source/drain feature in the source/drain trench,
    wherein each of the plurality of second layers comprises:
        a bottom sublayer,
        a middle sublayer over the bottom sublayer, and
        a top sublayer over the middle sublayer,
    wherein a first germanium (Ge) concentration in the middle sublayer is lower than a second germanium (Ge) concentration of the bottom sublayer or the top sublayer.

2. The method of claim 1,
    wherein the plurality of first layers comprise silicon (Si),
    wherein the plurality of second layers comprise silicon germanium (SiGe).

3. The method of claim 1,
    wherein the first germanium (Ge) concentration is about 5% to about 50%,
    wherein the second germanium (Ge) concentration is about 20% to about 60%.

4. The method of claim 1,
    wherein the first germanium (Ge) concentration is about 15% to about 35%,
    wherein the second germanium (Ge) concentration is about 30% to about 50%.

5. The method of claim 1, wherein a ratio of the second germanium (Ge) concentration to the first germanium (Ge) concentration is between about 1.1 and about 7.

6. The method of claim 1, wherein a ratio of the second germanium (Ge) concentration to the first germanium (Ge) concentration is between about 1.2 and about 3.

7. The method of claim 1,
    wherein the plurality of first layers comprises three (3) first layers,
    wherein the plurality of second layers comprises three (3) second layers.

8. The method of claim 1,
    wherein the fin-shaped structure rises from the substrate along a vertical direction,
    wherein the bottom sublayer comprises a first thickness along the vertical direction,
    wherein the middle sublayer comprises a second thickness along the vertical direction,
    wherein the top sublayer comprises a third thickness along the vertical direction,
    wherein the second thickness is greater than the first thickness or the third thickness.

9. The method of claim 8,
    wherein the first thickness is between about 0.5 nm and about 2.5 nm,
    wherein the second thickness is between about 2.5 nm and about 5 nm,
    wherein the third thickness is between about 0.5 nm and about 2.5 nm.

10. The method of claim 1, wherein the selectively and partially etching of the sidewalls of the plurality of second layers comprises use of a wet etching process.

11. The method of claim 1, wherein the selectively and partially etching of the sidewalls of the plurality of second layers comprises use of a mixture of ammonia hydroxide ($NH_4OH$), hydrogen peroxide ($H_2O_2$), and water ($H_2O$).

12. A method, comprising:
forming over a substrate a stack that comprises a plurality of first layers interleaved by a plurality of second layers;
patterning the stack to form a fin-shaped structure comprising a channel region and a source/drain region;
forming a dummy gate stack over the channel region of the fin-shaped structure;
etching the source/drain region of the fin-shaped structure to form a source/drain trench that exposes sidewalls of the plurality of first layer and the plurality of second layers;
selectively and partially etching the sidewalls of the plurality of second layers to form inner spacer recesses;
forming inner spacer features in the inner spacer recesses; and
after the forming of the inner spacer features, forming a source/drain feature in the source/drain trench,
wherein each of the plurality of second layers comprises:
a bottom sublayer,
a middle sublayer over the bottom sublayer, and
a top sublayer over the middle sublayer,
wherein each of the bottom sublayer, the middle sublayer and the top sublayer comprises silicon germanium (SiGe),
wherein a first germanium (Ge) concentration in the bottom sublayer and the top sublayer is greater than a second germanium (Ge) concentration in the middle sublayer such that the selectively and partially etching etches the bottom sublayer and the top sublayer a rate different from a rate the selectively and partially etching etches the middle sublayer.

13. The method of claim 12,
wherein the first germanium (Ge) concentration is about 15% to about 35%,
wherein the second germanium (Ge) concentration is about 30% to about 50%.

14. The method of claim 12, wherein a ratio of the second germanium (Ge) concentration to the first germanium (Ge) concentration is between about 1.2 and about 3.

15. The method of claim 12,
wherein the fin-shaped structure rises from the substrate along a vertical direction,
wherein the bottom sublayer comprises a first thickness along the vertical direction,
wherein the middle sublayer comprises a second thickness along the vertical direction,
wherein the top sublayer comprises a third thickness along the vertical direction,
wherein the second thickness is greater than the first thickness or the third thickness.

16. The method of claim 15,
wherein the first thickness is between about 0.5 nm and about 2.5 nm,
wherein the second thickness is between about 2.5 nm and about 5 nm,
wherein the third thickness is between about 0.5 nm and about 2.5 nm.

17. A method, comprising:
forming over a substrate a stack that comprises a plurality of first layers interleaved by a plurality of second layers;
patterning the stack to form a fin-shaped structure comprising a channel region and a source/drain region;
forming a dummy gate stack over the channel region of the fin-shaped structure;
etching the source/drain region of the fin-shaped structure to form a source/drain trench that exposes sidewalls of the plurality of first layer and the plurality of second layers;
selectively and partially etching the sidewalls of the plurality of second layers to form inner spacer recesses;
forming inner spacer features in the inner spacer recesses; and
after the forming of the inner spacer features, forming a source/drain feature in the source/drain trench,
wherein each of the plurality of second layers comprises:
a bottom sublayer,
a middle sublayer over the bottom sublayer, and
a top sublayer over the middle sublayer,
wherein a first germanium (Ge) concentration in the middle sublayer is lower than a second germanium (Ge) concentration of the bottom sublayer or the top sublayer,
wherein the bottom sublayer comprises a first thickness,
wherein the middle sublayer comprises a second thickness,
wherein the top sublayer comprises a third thickness,
wherein the second thickness is greater than the first thickness or the third thickness.

18. The method of claim 17,
wherein the plurality of first layers comprise silicon (Si),
wherein the plurality of second layers comprise silicon germanium (SiGe).

19. The method of claim 17, wherein the selectively and partially etching of the sidewalls of the plurality of second layers comprises use of a wet etching process.

20. The method of claim 17, wherein the selectively and partially etching of the sidewalls of the plurality of second layers comprises use of a mixture of ammonia hydroxide ($NH_4OH$), hydrogen peroxide ($H_2O_2$), and water ($H_2O$).

* * * * *